(12) United States Patent
Kurokawa

(10) Patent No.: US 8,610,696 B2
(45) Date of Patent: Dec. 17, 2013

(54) SEMICONDUCTOR DEVICE AND DISPLAY DEVICE INCLUDING THE SAME

(75) Inventor: Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 498 days.

(21) Appl. No.: 13/020,829

(22) Filed: Feb. 4, 2011

(65) Prior Publication Data

US 2011/0199351 A1 Aug. 18, 2011

(30) Foreign Application Priority Data

Feb. 12, 2010 (JP) ................. 2010-029010

(51) Int. Cl.
*G06F 3/038* (2013.01)
*G09G 5/00* (2006.01)

(52) U.S. Cl.
USPC .............................. 345/207; 345/92; 326/104

(58) Field of Classification Search
USPC ............ 345/87–100, 204–207; 326/104, 108, 326/112, 114
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,747,638 B2 | 6/2004 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,265,707 B2 | 9/2007 | Mizukami et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

(Continued)

*Primary Examiner* — Kimnhung Nguyen
(74) *Attorney, Agent, or Firm* — Nixon Peabody LLP; Jeffrey L. Costellia

(57) ABSTRACT

A semiconductor circuit including: an A/D converter circuit which converts an inputted first signal into a second signal. The A/D converter circuit includes a comparator circuit which compares a voltage of the first signal and a reference voltage; an A/D conversion controller circuit which outputs a digital signal in accordance with comparison results given by the comparator circuit, as a fourth signal and which outputs, in accordance with the third signal, a digital signal corresponding to the first signal, as the second signal; and a D/A converter which converts an inputted fourth signal into an analog signal and which outputs the analog signal as the reference signal. The comparator circuit includes a transistor having a first gate and a second gate. The first signal is inputted to the first gate, the reference signal is inputted to the second gate.

22 Claims, 17 Drawing Sheets

(56) References Cited

U.S. PATENT DOCUMENTS

| | | | |
|---|---|---|---|
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,868,882 B2 * | 1/2011 | Kobashi | 345/207 |
| 8,106,345 B2 * | 1/2012 | Kim et al. | 250/214 AL |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0289174 A1 | 11/2009 | Koyama et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0134735 A1 | 6/2010 | Nakamura et al. | |
| 2010/0276689 A1 | 11/2010 | Iwasaki | |
| 2010/0279462 A1 | 11/2010 | Iwasaki | |
| 2011/0128777 A1 * | 6/2011 | Yamazaki et al. | 365/149 |

FOREIGN PATENT DOCUMENTS

| | | |
|---|---|---|
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 03-039930 | 4/1991 |
| JP | 05-251705 | 9/1993 |
| JP | 08-264794 | 10/1996 |
| JP | 11-505377 | 5/1999 |
| JP | 2000-044236 | 2/2000 |
| JP | 2000-150900 | 5/2000 |
| JP | 2000-209089 | 7/2000 |
| JP | 2001-292276 | 10/2001 |
| JP | 2002-076356 | 3/2002 |
| JP | 2002-289859 | 10/2002 |
| JP | 2003-086000 | 3/2003 |
| JP | 2003-086808 | 3/2003 |
| JP | 2004-103957 | 4/2004 |
| JP | 2004-273614 | 9/2004 |
| JP | 2004-273732 | 9/2004 |
| JP | 2007-103918 | 4/2007 |
| JP | 2008-193210 | 8/2008 |
| WO | WO-2004/114391 A1 | 12/2004 |
| WO | WO-2007/029844 A1 | 3/2007 |

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Hayashi et al., "42.1: Invited Paper: Improved Amoprhous In—Ga—Zn—O TFTs," SID Digest '08 : SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The phase relatiosn in the In2O3—Ga2ZnO4—ZnO system at 1350° C.," Journal of Solid State Chemistry, Aug. 1, 1991, vol. 93, No. 2, pp. 298-315.

(56) References Cited

OTHER PUBLICATIONS

Kimizuka et al., "Synthesis and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Osada et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Nomura et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Li et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Lee et al., "42.2: World's Largest (15-Inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector With Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorescent Organic Light-Emitting Devices Employing MoO3 as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs ," IDW '02: Proceedings of the 9th International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUS on Flexible and Glass Substrates for Secure RFID Systems," Journal of Solid-State Circuits , 2008, vol. 43, No. 1, pp. 292-299.

Ohara et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The 'Blue Phase'" Physics Letters, Sep. 10, 1973, vol. 45A, No. 2, pp. 115-116.

Cho et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display With Driver Circuit Using Amorphous In—Ga—Zn-Oxide TFTs," IDW '09: Proceedings of the 16th International Display Workshops, 2009, pp. 689-692.

Park et al., "Amorphous Indium-Gallium-Zinc Oxide TFTs and Their Application for Large Size AMOLED," AM-FPD '08 Digest of Technical Papers, Jul. 2, 2008, pp. 275-278.

Park et al., "Challenge to Future Displays: Transparent AM-OLED Driven by Peald Grown ZnO TFT," IMID '07 Digest, 2007, pp. 1249-1252.

Godo et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Osada et al., "Development of Driver-Integrated Panel Using Amorphous In—Ga—Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn-Oxide TFT," SID Digest '09 SID International Symposium Digest of Technical Papers, May 31, 2009, pp. 1110-1112.

Ohara et al., "21.3: 4.0 in. QVGA AMOLED Display Using In—Ga—Zn-Oxide TFTs With a Novel Passivation Layer," SID Digest '09: SID International Symposium Digest of Technical Papers, May 31, 2009, pp. 284-287.

Miyasaka, "58.2: Invited Paper: Suftla Flexible Microelectronics on Their Way to Business," SID Digest '07 : SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13th International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel,YbFe2O4, and Yb2Fe3O7 Types of Structures for Compounds in the In2O3 and Sc2O3-A2O3-BO Systems [A; Fe, Ga, or Al: B: Mg, Mn, Fe, Ni, Cu, or Zn] at Temperatures Over 1000° C.," Journal of Solid State Chemistry, 1985, vol. 60, pp. 382-384.

(56) References Cited

OTHER PUBLICATIONS

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent InGaZnO4," Phys. Rev. B (Physical Review. B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review. B), 2008, vol. 77, pp. 245202-1-245202-6.

Orita et al., "Amorphous transparent conductive oxide InGaO3(ZnO)m (m≤4): a Zn4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim at al., "High-Performance oxide thin film transistors passivated by various gas plasmas," 214th ECS Meeting, 2008, No. 2317, ECS.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park at al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ueno at al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

International Search Report (Application No. PCT/JP2011/051536; PCT13195) Dated Mar. 1, 2011.

Written Opinion (Application No. PCT/JP2011/051535; PCT13195) Dated Mar. 1, 2011.

\* cited by examiner

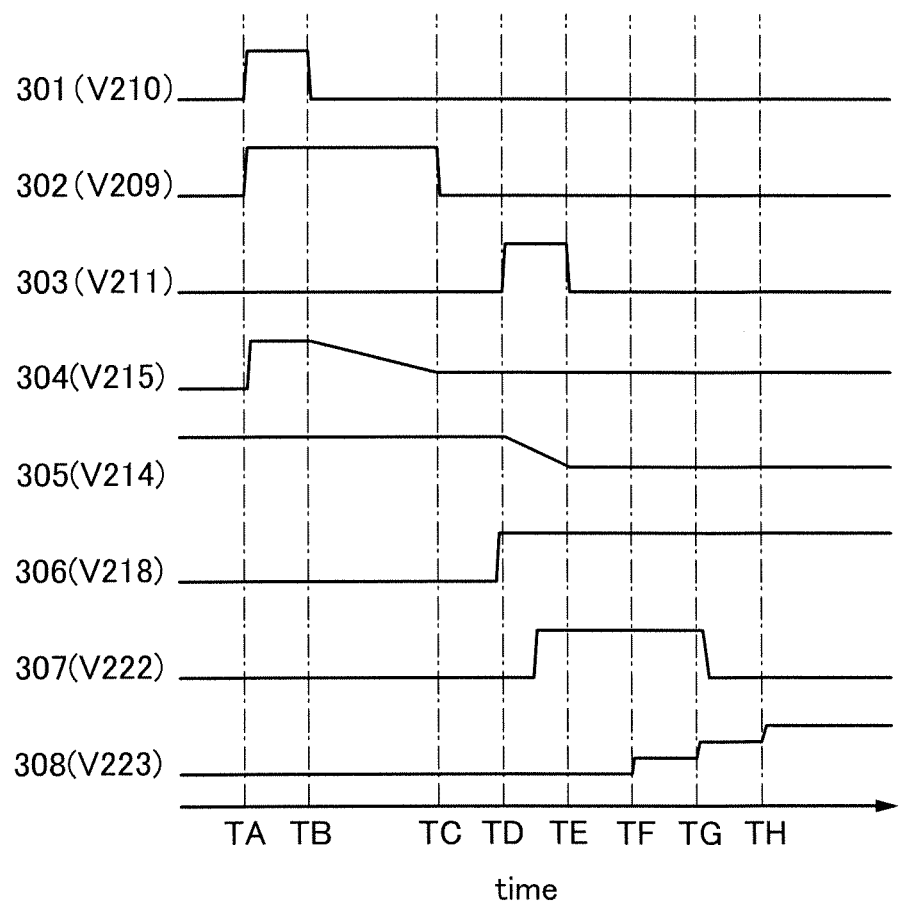

SEMICONDUCTOR DEVICE AND DISPLAY DEVICE INCLUDING THE SAME

TECHNICAL FIELD

One embodiment of the present invention relates to a semiconductor circuit and a display device.

BACKGROUND ART

In recent years, semiconductor devices with light-detecting sensors (also referred to as photosensors, photosensor circuits, or photoelectric conversion circuits) have attracted attention. For example, display devices with photosensors used as touch sensors, are called touch panels, touch screens (also referred to as touch panels), or the like. The touch panel includes photosensors in a display area and thus the display area also functions as an input area. An example of touch panels is display devices with an image capture function (see Patent Document 1, for example). Examples of semiconductor circuits including a photosensor are CCD image sensors and CMOS image sensors. Semiconductor circuits such as CCD image sensors or CMOS image sensors are used, for example, in electronic appliances such as digital still cameras or cellular phones.

In a display device with photosensors, light emitted by the display device is reflected by an object and the photosensors in a pixel portion of the display device detect the reflected light; thus, the existence of the object over the pixel portion can be recognized. Further, in a display device with a photosensor, light emitted by an object or light reflected by an object is detected by the photosensor directly or after the light is gathered by an optical lens or the like.

Reference

[Patent Document 1] Japanese Published Patent Application No. 2001-292276

DISCLOSURE OF INVENTION

To capture an image of an object by the above-stated semiconductor circuit or display device, it is necessary to generate a signal by light detected by the photosensor and utilize the generated signal. A signal generated by light detected by the photosensor is generally an analog signal. To capture an image, it is necessary to convert an analog signal into a digital signal by a circuit that converts an analog signal into a digital signal (also referred to as an A/D converter circuit or an A/Dconv).

In order to achieve a display device with a high-resolution image capture function, a high-performance A/D converter circuit capable of high-resolution signal conversion is required. However, when an A/D converter circuit has a complicated circuit configuration to have high-performance, the area of the semiconductor circuit or display device increases and the manufacturing cost of a semiconductor circuit or display device may increase.

An object of one embodiment of the present invention is to improve the resolution of signal conversion. Another object of one embodiment of the present invention is to simplify the circuit configuration of an A/D converter circuit. Note that in one embodiment of the present invention, it is only necessary that at least one of the above-stated objects is achieved.

One embodiment of the present invention has an A/D converter circuit including a comparator circuit using a transistor, the threshold voltage of which varies successively by using a control signal, and allows a signal inputted to the comparator circuit to be converted into a digital signal, the digital value of which corresponds to the threshold voltage of the transistor, and thus simplifies the circuit configuration of the comparator circuit, thereby simplifying the circuit configuration of the A/D converter circuit and improving the resolution of signal conversion in A/D conversion of an image capture operation.

One embodiment of the present invention is a semiconductor circuit including: an A/D converter circuit to which a first signal is inputted and which converts the inputted first signal into a second signal being a digital signal having a digital value corresponding to a voltage value of the first signal. The A/D converter circuit includes: a comparator circuit to which the first signal is inputted and which compares a voltage of the first signal and a reference voltage being a voltage having a value successively varying and being used in order for varying values to correspond to data of a particular digital value and which outputs a voltage determined in accordance with comparison results, as a third signal; an A/D conversion controller circuit to which the third signal is inputted and which outputs a digital signal having a digital value successively varying in accordance with the third signal, as a fourth signal and which outputs, in accordance with the third signal, a digital signal having a digital value corresponding to the voltage value of the first signal, as the second signal; and a D/A converter to which the fourth signal is inputted and which converts the fourth signal into an analog signal and which outputs the analog signal as a fifth signal. The comparator circuit includes a transistor having a source, a drain, a first gate, and a second gate. The first signal is inputted to the first gate, the fifth signal is inputted to the second gate, and a voltage of one of the source and the drain is a voltage of the third signal.

One embodiment of the present invention is a semiconductor circuit including: a photoelectric conversion circuit which generates, when receiving light, a voltage having a value corresponding to an intensity of the light and which outputs the generated voltage as a first signal; and an A/D converter circuit to which the first signal is inputted and which converts the inputted first signal into a second signal being a digital signal having a digital value corresponding to a voltage value of the first signal. The A/D converter circuit includes: a comparator circuit to which the first signal is inputted and which compares a voltage of the first signal and a reference voltage being a voltage having a value successively varying and being used in order for varying values to correspond to data of a particular digital value and which outputs a voltage determined in accordance with the comparison results as a third signal; an A/D conversion controller circuit to which the third signal is inputted and which outputs a digital signal having a digital value successively varying in accordance with the third signal, as a fourth signal and which outputs, in accordance with the third signal, a digital signal having a digital value corresponding to a voltage value of the first signal, as the second signal; and a D/A converter to which the fourth signal is inputted and which converts the fourth signal into an analog signal and which outputs the analog signal as a fifth signal. The comparator circuit includes a resistor and a transistor having a source, a drain, a first gate, and a second gate. A first power supply voltage is applied to one of the source and the drain through the resistor, a second power supply voltage is applied to the other of the source and the drain, the first signal is inputted to the first gate, the fifth signal is inputted to the second gate, and a voltage of one of the source and the drain is a voltage of the third signal.

One embodiment of the present invention is a display device including: a pixel circuit including a display circuit and a photoelectric conversion circuit which generates, when receiving light, a voltage having a value corresponding to an intensity of the light and which outputs the generated voltage as a first signal; and a driver circuit controlling an operation of the pixel circuit. The driver circuit includes an A/D converter circuit to which the first signal is inputted and which converts the inputted first signal into a second signal being a digital signal having a digital value corresponding to a voltage value of the first signal. The A/D converter circuit includes: a comparator circuit to which the first signal is inputted and which compares a voltage of the first signal and a reference voltage being a voltage having a value successively varying and being used in order for varying values to correspond to data of a particular digital value and which outputs a voltage determined in accordance with comparison results as a third signal; an A/D conversion controller circuit to which the third signal is inputted and which outputs a digital signal having a digital value successively varying in accordance with the third signal, as a fourth signal and which outputs, in accordance with the third signal, a digital signal having a digital value corresponding to the voltage value of the first signal, as the second signal; and a D/A converter to which the fourth signal is inputted and which converts the fourth signal into an analog signal and which outputs the analog signal as a fifth signal. The comparator circuit includes a resistor and a transistor having a source, a drain, a first gate, and a second gate. A first power supply voltage is applied to one of the source and the drain through the resistor, a second power supply voltage is applied to the other of the source and the drain, the first signal is inputted to the first gate, the fifth signal is inputted to the second gate, and a voltage of one of the source and the drain is a voltage of the third signal.

In this specification and claims, ordinal numbers such as "first" and "second" do not limit number and are used to prevent confusion between components.

According to one embodiment of the present invention, the configuration of a comparator circuit can be simplified, so that the circuit configuration of an A/D converter circuit can be simplified.

Moreover, according to one embodiment of the present invention, a transistor the threshold voltage of which can be controlled is used in a comparator circuit; thus, it is possible to set the value of a digital signal, which is an output signal of an A/D converter circuit, by setting freely a voltage applied to a second gate of the transistor, so that the resolution of signal conversion can be improved.

BRIEF DESCRIPTION OF DRAWINGS

FIG. 9 is a timing diagram for describing a read operation performed by a photosensor in the display device shown in FIG. 8.

BEST MODE FOR CARRYING OUT THE INVENTION

Figure 1:
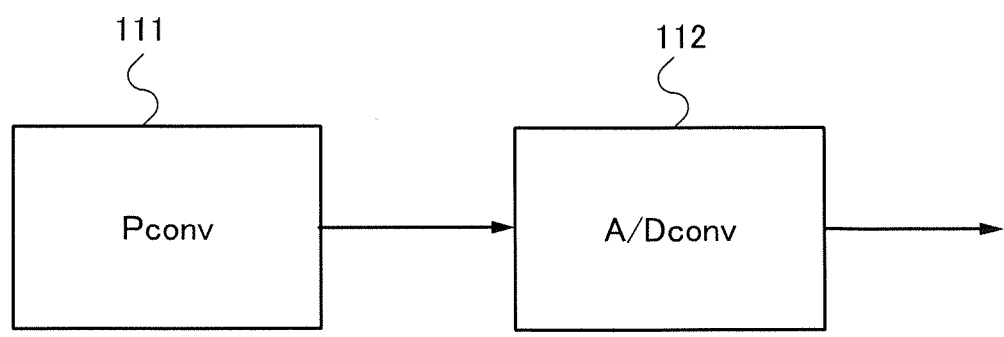
FIG. 1 is a block diagram showing an example of the configuration of a semiconductor circuit of Embodiment 1.

Embodiments of the present invention will be hereinafter described in detail with reference to the accompanying drawings. Note that the following embodiments can be implemented in many different modes, and it is apparent to those skilled in the art that modes and details can be modified in various ways without departing from the spirit and scope of the present invention. Therefore, the present invention is not interpreted as being limited to the description of the embodiments below. Note that in all the drawings for explaining the embodiments, like portions or portions having a similar function are denoted by same reference numerals, and the description thereof is omitted in some cases.

(Embodiment 1)

In this embodiment, a semiconductor circuit capable of converting an input signal into a digital signal will be described.

An example of the configuration of the semiconductor circuit of this embodiment will be described with reference to FIG. 1. FIG. 1 is a block diagram showing an example of the configuration of the semiconductor circuit of this embodiment.

A semiconductor circuit shown in FIG. 1 includes a photoelectric conversion circuit (also referred to as Pconv) 111 and an A/D converter circuit 112.

The photoelectric conversion circuit 111 has a function of generating, when receiving light, a voltage V11 the value of which corresponds to the intensity of the light, and outputting the generated voltage V11 as a signal S11. Note that the photoelectric conversion circuit 111 is not necessarily provided. It is only necessary that a voltage with a predetermined wave form is inputted to the A/D converter circuit 112 as an input signal.

Note that voltage generally refers to a difference between potentials at two points (also referred to as a potential difference). However, values of both a voltage and a potential are represented using volt (V) in a circuit diagram or the like in some cases, so that it is difficult to discriminate between them. This is why in this specification, a potential difference between a potential at one point and a potential to be the reference (also referred to as the reference potential) is used as a voltage at the point in some cases.

The photoelectric conversion circuit 111 includes, for example, a photoelectric conversion element (also referred to as a PCE) and a transistor. The photoelectric conversion element generates a current (also referred to as a photocurrent) the value of which corresponds to the intensity of incident light, while the photoelectric conversion circuit 111 generates the voltage V11 the value of which corresponds to a current generated by the photoelectric conversion element. A photodiode or a phototransistor, for example, can be used as the photoelectric conversion element. In the semiconductor circuit of this embodiment, the photoelectric conversion circuit 111 can include an amplifier circuit that amplifies photocurrent generated by the photoelectric conversion element.

In this specification, a transistor refers to a field-effect transistor that includes, at least a source, a drain, and a gate unless otherwise specified.

A source refers to a part or the whole of a source electrode, or a part or the whole of a source line. In some cases, a conductive layer that serves as both a source electrode and a source line is referred to as a source without making a distinction between a source electrode and a source line.

A drain refers to a part or the whole of a drain electrode, or a part or the whole of a drain line. In some cases, a conductive layer that serves as both a drain electrode and a drain line is referred to as a drain without distinction between a drain electrode and a drain line.

A gate refers to a part or the whole of a gate electrode, or a part or the whole of a gate line. In some cases, a conductive layer that serves as both a gate electrode and a gate line is referred to as a gate without distinction between a gate electrode and a gate line.

Further, a source and a drain of a transistor may interchange with each other depending on the structure, the operating condition, and the like of the transistor; therefore, it is difficult to define which is the source or the drain. Therefore, in this document (the specification, the claims, the drawings, or the like), one of a source and a drain of a transistor is referred to as a first terminal, and the other is referred to as a second terminal in some cases. When one of a source and a drain is referred to as a first terminal and the other a second terminal, a gate is referred to as a third terminal in some cases.

In addition, in this specification, a transistor has a plurality of gates in some cases. When a transistor has two gates, for example, these gates are called a first gate and a second gate (also referred to as a back gate). Note that when a transistor has a first gate and a second gate, the first gate is referred to as a third terminal, and the second gate is referred to as a fourth terminal in some cases.

The A/D converter circuit 112 is a circuit that converts an input signal into a digital signal. The signal S11 is inputted to the A/D converter circuit 112. The A/D converter circuit 112 has a function of converting the signal S11 into a digital signal the digital value of which corresponds to the voltage of the signal S11 and outputting the digital signal as a signal S12.

Figure 2:
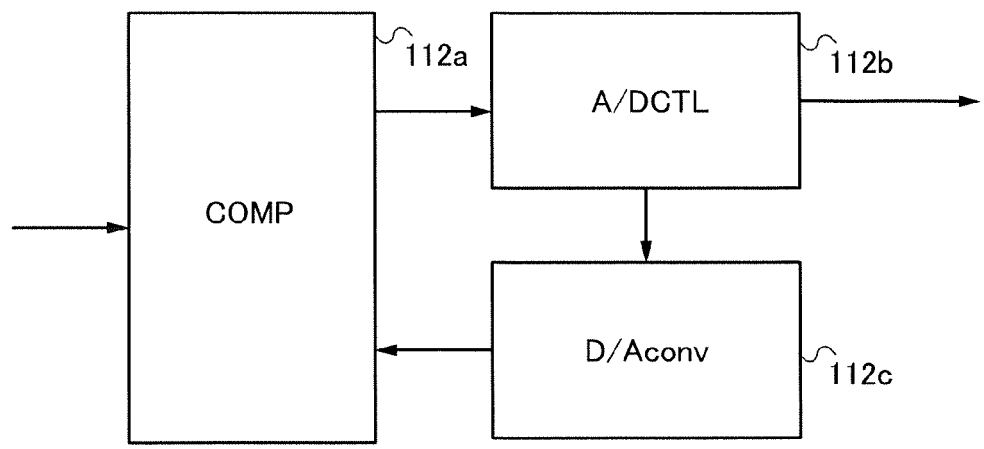
FIG. 2 is a circuit diagram showing an example of the configuration of an A/D converter circuit shown in FIG. 1.

An example of the circuit configuration of the A/D converter circuit 112 will be described with reference to FIG. 2. FIG. 2 is a circuit diagram showing an example of the circuit configuration of the A/D converter circuit shown in FIG. 1.

An A/D converter circuit shown in FIG. 2 includes a comparator circuit (also referred to as a comparator or COMP) 112a, an A/D conversion controller circuit (also referred to as A/DCTL) 112b, and a D/A converter (also referred to as D/Aconv) 112e.

The signal S11 is inputted to the comparator circuit 12a. The comparator circuit 112a has a function of comparing the voltage of the signal S11 with a reference voltage and outputting a voltage determined in accordance with the comparison results, as a signal S21. The reference voltage is a voltage the value of which varies successively, and each of its values corresponds to data of a certain digital value. Note that the reference voltage may be a voltage the value of which becomes successively larger. The comparator circuit 112a includes a transistor having a first gate and a second gate.

The signal S21 is inputted from the comparator circuit 112a to the A/D conversion controller circuit 112b. The A/D conversion controller circuit 112b has a function of outputting a data signal, the digital value of which successively varies in accordance with the inputted signal S21, as a signal S22 to the D/A converter 112c, and outputting a digital signal, the digital value of which corresponds to the voltage of the signal S11, as the signal S12 in accordance with the inputted signal S21. The A/D conversion controller circuit 112b includes, for example, a successive approximation register and the like.

The signal S22 is inputted to the D/A converter 112c from the A/D conversion controller circuit 112b. The D/A converter 112c has a function of converting the inputted signal S22 into an analog signal and outputting the analog signal as a control signal CTL11 to the second gate of the transistor included in the comparator circuit 112a.

The control signal CTL11 is one of the signals used to set the threshold voltage of the transistor included in the comparator circuit 112a and is the above-stated reference voltage.

Note that in the A/D converter circuit of this embodiment, the comparator circuit 112a can be formed over the same substrate as the photoelectric conversion circuit 111. Further, it is acceptable that the A/D conversion controller circuit 112b and the D/A converter 112c are formed over the same substrate as the comparator circuit 112a, or the A/D conversion controller circuit 112b and the D/A converter 112c, which are provided as external devices, are electrically connected to the comparator circuit 112a.

Figure 3:
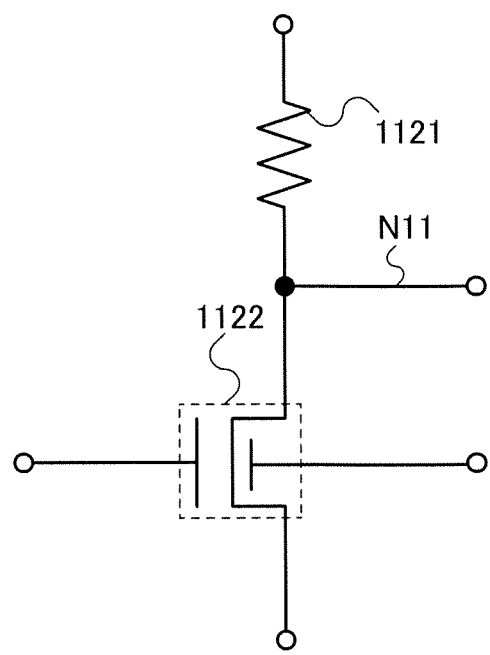
FIG. 3 is a circuit diagram showing an example of the circuit configuration of a comparator circuit shown in FIG. 2.

An example of the circuit configuration of the comparator circuit 112a shown in FIG. 2 will be described with reference to FIG. 3. FIG. 3 is a circuit diagram showing an example of the circuit configuration of the comparator circuit in FIG. 2.

The comparator circuit shown in FIG. 3 includes a resistor 1121 and a transistor 1122. Note that the comparator circuit of this embodiment can include a diode or a transistor in which a gate is electrically connected to a source or a drain (also referred to as a diode-connected transistor) instead of the resistor 1121, for example.

The transistor 1122 includes a source, a drain, a first gate, and a second gate.

A first terminal of the transistor 1122 is electrically connected to the resistor 1121. A voltage Va is applied to the first terminal of the transistor 1122 through the resistor 1121. A voltage Vb is applied to a second terminal of the transistor 1122. The signal S11 is inputted to the first gate of the transistor 1122. The control signal CTL11 is inputted to the second gate of the transistor 1122. The comparator circuit shown in FIG. 3 outputs the voltage of a connection point between the first terminal of the transistor 1122 and the resistor 1121 (also referred to as a node N11), as the signal S21.

One of the voltage Va and the voltage Vb is a high supply voltage Vdd, and the other a low supply voltage Vss. The high supply voltage Vdd is a voltage the value of which is relatively higher than that of the low supply voltage Vss. The low supply voltage Vss is a voltage the value of which is relatively lower than that of the high supply voltage Vdd. The value of the voltage Va and the value of the voltage Vb might interchange depending, for example, on the conductivity type of the transistor.

A transistor with low off-state current, for example, can be used as the transistor 1122. The use of a transistor with low off-state current can suppress variations in the voltage of the node N11 due to leakage current between the source and the drain of the transistor 1122. For example, a transistor having an oxide semiconductor layer that serves as a channel formation layer can be used as such a transistor with low off-state current. The off-state current per micrometer of channel width of the above-mentioned transistor having an oxide semiconductor layer is 10 aA/μm ($1\times10^{-17}$ A/μm) or less, 1 aA/μm ($1\times10^{-18}$ A/μm) or less, 10 zA/μm ($1\times10^{-20}$ A/μm) or less, or 1 zA ($1\times10^{-21}$ A/μm) or less.

As shown in FIG. 3 as an example, the comparator circuit includes a transistor the threshold voltage of which varies successively by using the control signal CTL11. Thus, it is possible to simplify the circuit configuration of the comparator circuit.

Next, an example of the operation of the semiconductor circuit shown in FIG. 1 will be described. Here, as an example, the configuration of the A/D converter circuit 112 is that of the A/D converter circuit shown in FIG. 2, and the configuration of the comparator circuit 112a shown in FIG. 2 is that of the comparator circuit shown in FIG. 3.

First, light enters the photoelectric conversion circuit 111.

In the photoelectric conversion circuit 111, the photoelectric conversion element generates photocurrent the value of which corresponds to the intensity of incident light. Further, the photoelectric conversion circuit 111 generates the voltage V11, the value of which corresponds to the generated photocurrent, and outputs the generated voltage V11 as the signal S11.

The signal S11 is inputted to the first gate of the transistor 1122 included in the comparator circuit 112a of the A/D converter circuit 112.

In the case where the transistor 1122 is an n-type transistor, the transistor 1122 is off (in the state OFF) when the voltage of the signal S11 is lower than the threshold voltage of the transistor 1122. In the case where the transistor 1122 is a p-type transistor, the transistor 1122 is off when the voltage of the signal S11 is higher than the threshold voltage of the transistor 1122. When the transistor 1122 is off, the value of the voltage of the node N11 is equivalent to the value of the voltage Va.

In the case where the transistor 1122 is an n-type transistor, the transistor 1122 is on (in the state ON) when the voltage of the signal S11 (also referred to as the voltage V11) is higher than the threshold voltage of the transistor 1122. In the case where the transistor 1122 is a p-type transistor, the transistor 1122 is on when the voltage of the signal S11 is lower than the threshold voltage of the transistor 1122. When the transistor 1122 is on, the value of the voltage of the node N11 is equivalent to the value of the voltage Vb.

The threshold voltage of the transistor 1122 is determined by the voltage of the second gate of the transistor 1122. Therefore, the threshold voltage of the transistor 1122 is changed by the value of the control signal CTL11. For example, in the case where a transistor (e.g., the transistor 1122) is an n-type transistor, the threshold voltage of the transistor decreases as the value of the voltage of a control signal (e.g., the control signal CTL11) increases. Note that the control signal CTL11 is generated using the A/D conversion controller circuit 112b and the D/A converter 112c.

Further, the comparator circuit 112a outputs the voltage of the node N11 as the signal S21 to the A/D conversion controller circuit 112b.

The A/D conversion controller circuit 112b outputs a data signal, the digital value of which varies successively, to the D/A converter 112c.

The D/A converter 112c converts the above-stated data signal inputted from the A/D conversion controller circuit 112b into an analog signal and outputs the converted analog signal as the control signal CTL11 to the second gate of the transistor 1122.

Further, the A/D conversion controller circuit 112b outputs a digital signal the digital value of which corresponds to the voltage of the signal S11 as the signal S12, in accordance with the signal S21 inputted from the comparator circuit 112a. For example, the A/D conversion controller circuit 112b converts the signal S11 into a digital signal the digital value of which corresponds to the value of the voltage of the control signal CTL11 obtained when the state of the transistor 1122 changes (e.g., when the transistor 1122 switches between on and off).

Figure 4:
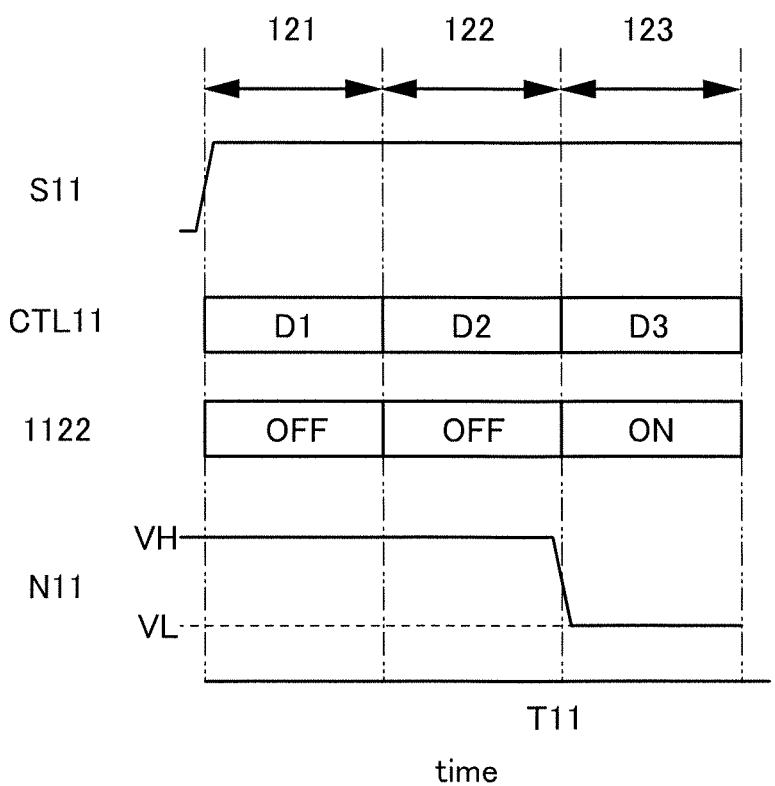
FIG. 4 is a diagram for describing an example of the operation of the A/D converter circuit shown in FIG. 1.

An example of the operation of the A/D converter circuit shown in FIG. 1 will be described with FIG. 4. FIG. 4 is a diagram for describing an example of the operation of the A/D converter circuit shown in FIG. 1, and shows the voltage waveform of the signal S11, the state of the control signal CTL11, the state of the transistor 1122, and the voltage waveform of the node N11. Note that here, as an example, the configuration of the A/D converter circuit 112 is that of the A/D converter circuit shown in FIG. 2; the configuration of the comparator circuit 112a shown in FIG. 2 is that of the comparator circuit shown in FIG. 3; and the digital value corresponding to the voltage of the control signal CTL11 obtained when the transistor 1122 is turned on is used as a digital value for converting a digital signal.

As shown in FIG. 4, the value of the voltage of the signal S11 is a predetermined value, while the value of the voltage of the control signal CTL11 changes to a value corresponding to a digital value D1, a digital value D2, or a digital value D3 on a unit time basis (a period 121, a period 122, and a period 123).

Here, the transistor 1122 is of during the period 121 and the period 122 and is turned on at a time T11. In other words, the transistor 1122 is on in the period where the value of the voltage of the control signal CTL11 corresponds to the digital value D3 (the period 123). Note that the present invention is not limited to this: the transistor 1122 may be on in the period where the value of the voltage of the control signal CTL11 corresponds to the digital value D1 or the digital value D2.

When the transistor 1122 is on, the value of the voltage of the node N11 is equivalent to the value of the voltage Vb. Here, the signal S11 is converted into a digital signal, that is, the digital value D3, and the digital signal serves as the signal S12. The above is an example of the operation of the A/D converter circuit shown in FIG. 1.

As shown in FIG. 1, FIG. 2, and FIG. 3 as an example, the semiconductor circuit of this embodiment includes the A/D converter circuit with the comparator circuit having the transistor the threshold voltage of which varies successively by using the control signal CTL11. For the transistor, the threshold voltage is controlled by the second gate, and the value of the voltage of a signal inputted to the second gate varies successively. Thus, it is possible to simplify the circuit configuration of the comparator circuit and the configuration of the A/D converter circuit. In addition, it is possible to freely set the value of the voltage of a signal inputted to the second gate, improving the resolution of signal conversion (A/D conversion).

Moreover, in the semiconductor circuit of this embodiment, the photoelectric conversion circuit and the A/D converter circuit can be formed over the same substrate. This makes it possible to reduce noise in a signal inputted from the photoelectric conversion circuit to the A/D converter circuit and reduce manufacturing cost because the photoelectric conversion circuit can be fabricated in the same process as the A/D converter circuit.

(Embodiment 2)

In this embodiment, an example of a photoelectric conversion circuit applicable to the semiconductor circuit in Embodiment 1 will be described.

Figure 5:
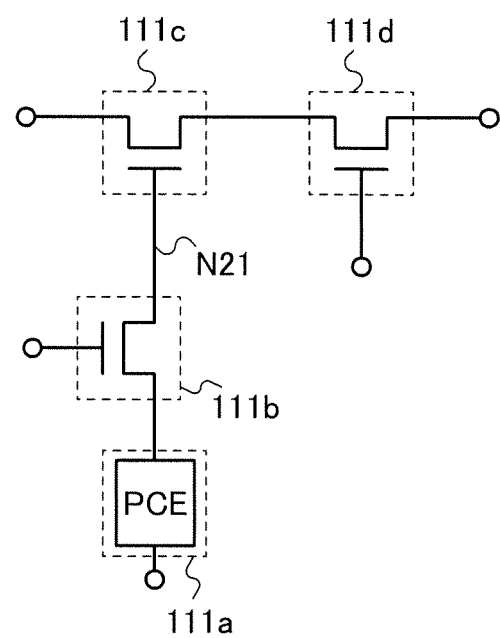
FIG. 5 is a circuit diagram showing an example of the circuit configuration of a photoelectric conversion circuit of Embodiment 2.

An example of the circuit configuration of a photoelectric conversion circuit of this embodiment will be described with reference to FIG. 5. FIG. 5 is a circuit diagram showing an example of the circuit configuration of the photoelectric conversion circuit in FIG. 1.

A photoelectric conversion circuit shown in FIG. 5 includes a photoelectric conversion element 111a, a transistor 111b, a transistor 111c, and a transistor 111d.

The photoelectric conversion element 111a has a function of generating, when receiving light, photocurrent in accordance with the intensity of the light. The photoelectric conversion element 111a has a first terminal and a second terminal. A signal S31 is inputted to the first terminal of the photoelectric conversion element 111a. The photoelectric conversion element 111a can be a photodiode or a phototransistor, for example. When the photoelectric conversion element 111a is a photodiode, its anode corresponds to one of the first terminal and the second terminal of the photoelectric conversion element 111a, and its cathode corresponds to the other. When the photoelectric conversion element 111a is a phototransistor, its source corresponds to one of the first terminal and the second terminal of the photoelectric conversion element 111a, and its drain corresponds to the other. The signal S31 is a signal for controlling whether the photoelectric conversion element 111a is in the conducting state (also referred to as the state C) or in the non-conducting state (also referred to as the state NC). Note that in the photodiode, the conducting state is a state where a forward voltage is applied and a current flows between the first terminal and the second terminal, while the non-conducting state is a state where a reverse voltage is applied. In addition, when the photodiode is in the non-conducting state, light incident thereon may cause a current to flow between the first terminal and the second terminal. In the phototransistor, the conducting state refers to the on state, while the non-conducting state refers to the off state. In addition, when the phototransistor is in the non-conducting state, light incident thereon may cause a current to flow between the first terminal and the second terminal.

The first terminal of the transistor 111b is electrically connected to the second terminal of the photoelectric conversion element 111a. A signal S32 is inputted to the gate of the transistor 111b. The signal S32 is a signal for controlling the on and off of the transistor 111b.

A transistor with low off-state current, for example, can be used as the transistor 111b. The use of a transistor with low off-state current can suppress variations in the voltage of the second terminal of the transistor 111b due to leakage current between the source and the drain of the transistor 111b. For example, the transistor of Embodiment 1 which has an oxide semiconductor layer that serves as a channel formation layer can be used as such a transistor with low off-state current. Note that in the photoelectric conversion circuit of this embodiment, the transistor 111b is not necessarily provided although when the transistor 111b is provided, that is, when the gate of the transistor 111c is floating, the value of the voltage of the gate of the transistor 111e can be maintained for a certain period of time.

The voltage Va is inputted to the first terminal of the transistor 111c. The gate of the transistor 111c is electrically connected to the second terminal of the transistor 111b. Note that a connection point between the gate of the transistor 111c and the second terminal of the transistor 111b is also referred to as a node N21.

The first terminal of the transistor 111d is electrically connected to the second terminal of the transistor 111c. A signal S33 is inputted to the gate of the transistor 111d. The signal S33 is a signal for controlling the on and off of the transistor 111d.

In the photoelectric conversion circuit of this embodiment, the transistor 111d is not necessarily provided although providing the transistor 111d makes it possible to control the timing of outputting a voltage corresponding to the intensity of light entering the photoelectric conversion element 111a as the signal S11 to the A/D converter circuit 112 shown in FIG. 1. The configuration of the photoelectric conversion circuit of this embodiment is not limited to that shown in FIG. 5; in the photoelectric conversion circuit of this embodiment, the voltage Va may be inputted to the first terminal of the transistor 111d, and the second terminal of the transistor 111d may be electrically connected to the first terminal of the transistor 111c. In this configuration, the voltage Va is inputted to the first terminal of the transistor 111c through the transistor 111d.

The photoelectric conversion circuit in FIG. 5 outputs the voltage of the second terminal of the transistor 111d as the signal S11.

Note that the configuration of the photoelectric conversion circuit of this embodiment is not limited to that shown in FIG. 5; the photoelectric conversion circuit of this embodiment can include a transistor for controlling whether or not the value of the voltage of the node N21, for example, is made equivalent to the value of the voltage Va. In this case, the voltage Va is inputted to a first terminal of the transistor, and a second terminal of the transistor is electrically connected to the gate of the transistor 111c. A transistor with a low off-state current is preferably used as the transistor. The use of the transistor with low off-state current can suppress variations in the voltage of the node N21 due to leakage current between a source and a drain of the transistor. For example, a transistor having an oxide semiconductor layer that serves as a channel formation layer can be used as such a transistor with low off-state current.

Note that the configuration of the photoelectric conversion circuit of this embodiment is not limited to that shown in FIG. 5; the photoelectric conversion circuit of this embodiment can include a transistor for controlling whether or not the value of the voltage of the second terminal of the transistor 111d, for example, is set to a predetermined value. Here, the voltage Va is inputted to a first terminal of the transistor, a second terminal of the transistor is electrically connected to the second terminal of the transistor 111d, and a control signal is inputted to a gate of the transistor.

Figure 6:
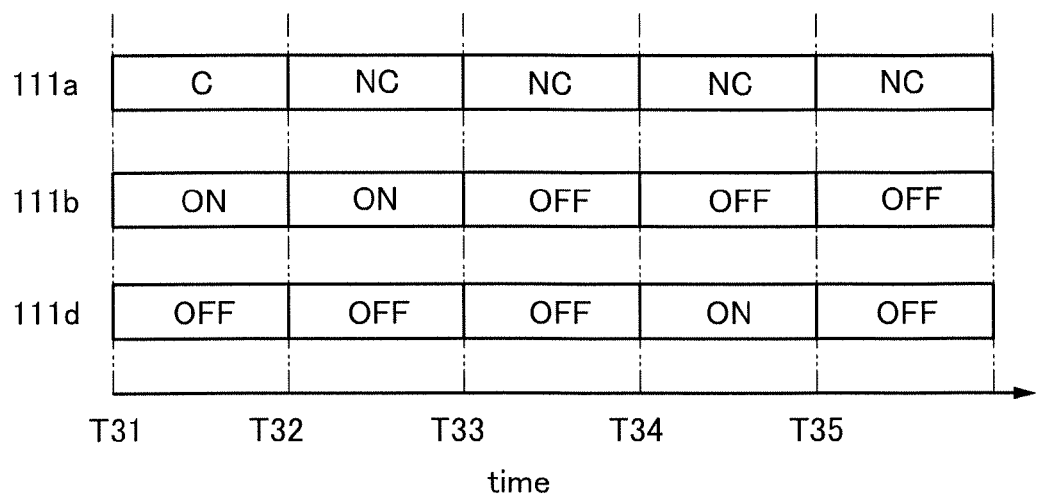
FIG. 6 is a diagram for describing an example of the operation of the photoelectric conversion circuit shown in FIG. 5.

Next, an example of the operation of the photoelectric conversion circuit shown in FIG. 5 will be described with reference to FIG. 6. FIG. 6 is a diagram for describing an example of the operation of the photoelectric conversion circuit shown in FIG. 5 and shows the state of the photoelectric conversion element 111a, the transistor 111b, and the transistor 111d.

An example of the operation of the photoelectric conversion circuit shown in FIG. 5 is as follows: first, at a time T31, the photoelectric conversion element 111a goes into the conducting state in response to the signal S31, the transistor 111b is turned on in response to the signal S32, and the transistor 111d is turned off in response to the signal S33.

Here, the value of the voltage of the node N21 is equivalent to the value of the voltage of the signal S31.

Then, at a time T32, the photoelectric conversion element 111a goes into the non-conducting state in response to the signal S31, the transistor 111b is on in response to the signal S32, and the transistor 111d is off in response to the signal S33.

Here, if light enters the photoelectric conversion element 111a, a photocurrent flows between the first terminal and the second terminal of the photoelectric conversion element 111a in accordance with the intensity of the light. Further, the value of the voltage of the node N21 varies in accordance with the amount of the photocurrent flowing between the first terminal and the second terminal of the photoelectric conversion element 111a. Furthermore, a current flowing between the first terminal and the second terminal of the transistor 111e varies in accordance with the voltage of the node N21.

Next, at a time T33, the photoelectric conversion element 111a is in the non-conducting state in response to the signal 531, the transistor 111b is turned off in response to the signal S32, and the transistor 111d is off in response to the signal S33.

At the time, the value of the voltage of the node N21 is maintained at a predetermined value for a certain period of time. Note that the predetermined value is a value corresponding to the amount of a current flowing between the first terminal and the second terminal of the photoelectric conversion element 111a from the time T32 to the time T33.

Then, at a time T34, the photoelectric conversion element 111a is in the non-conducting state in response to the signal S31, the transistor 111b is off in response to the signal S32, and the transistor 111d is turned on in response to the signal S33.

At the time, the voltage of the second terminal of the transistor 111d varies because of a current flowing between the first terminal and the second terminal of the transistor 111c and between the first terminal and the second terminal of the transistor 111d. Specifically, the value of the voltage of the second terminal of the transistor 111d varies in accordance with the intensity of light entering the photoelectric conversion element 111a.

Next, at a time T35, the photoelectric conversion element 111a is in the non-conducting state in response to the signal S31, the transistor 111b is off in response to the signal S32, and the transistor 111d is turned off in response to the signal 533.

Here, the value of the voltage of the second terminal of the transistor 111d is maintained at a predetermined value for a certain period of time. The predetermined value is a value corresponding to the amount of a current flowing between the first terminal and the second terminal of the photoelectric conversion element 111a from the time T32 to the time T33. Specifically, the value of the voltage of the second terminal of the transistor 111d is maintained at a value corresponding to the amount of light entering the photoelectric conversion element 111a. Note that it is also acceptable that a storage capacitor is provided to maintain the value of the voltage of the second terminal of the transistor 111d. In addition, the photoelectric conversion circuit in FIG. 5 outputs the voltage of the second terminal of the transistor 111d as the signal S11.

As described above, the operation of the photoelectric conversion circuit enables data of light entering the photoelectric conversion element 111a to be detected as a signal.

As shown in FIG. 5 as an example, an example of the photoelectric conversion circuit of this embodiment includes a photoelectric conversion element and a plurality of transistors. Thus, it is possible to generate a signal corresponding to the intensity of light entering the semiconductor circuit of Embodiment 1.

In addition, in an example of the photoelectric conversion circuit of this embodiment, all the transistors used can be of the same structure. When all the transistors used are of the same structure, the number of fabrication steps can be reduced. When the structures of the transistors used are different, it is possible to select and use as appropriate a transistor with a suitable structure for a needed function.

An example of the photoelectric conversion circuit of this embodiment can be formed in the same process and over the same substrate as the A/D converter circuit. This makes it possible to reduce noise in a signal inputted from the photoelectric conversion circuit to the A/D converter circuit and reduce manufacturing cost.

Note that this embodiment can be combined with or replaced by any of the other embodiments as appropriate.
(Embodiment 3)

In this embodiment, an example of a display device whose pixel portion employs a photodetection unit will be described.

Figure 7:
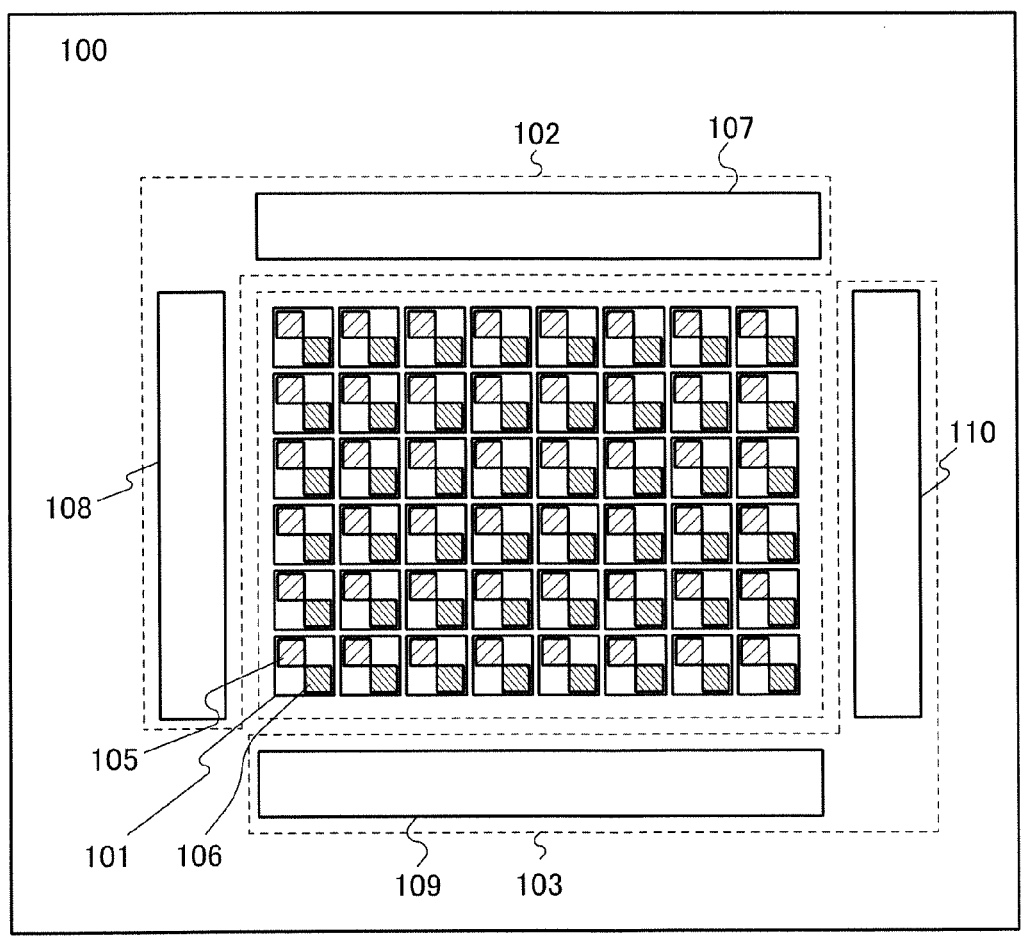
FIG. 7 is a block diagram showing an example of the structure of a display device of Embodiment 3.

First, an example of the structure of a display device of this embodiment will be described with reference to FIG. 7. FIG. 7 is a block diagram showing an example of the structure of the display device of this embodiment.

A display device 100 shown in FIG. 7 includes a pixel portion and a driver circuit area.

The pixel portion includes a plurality of pixels. The driver circuit area includes driver circuits for controlling the operation of the pixels (e.g., display operation and read (also referred to as readout) operation).

The pixel portion includes pixel circuits 101. The driver circuit area includes a display circuit controller circuit 102 and a photosensor controller circuit 103.

Each of the pixel circuits 101 includes a display circuit (also referred to as a display element) 105 and a photosensor 106.

Figure 8:
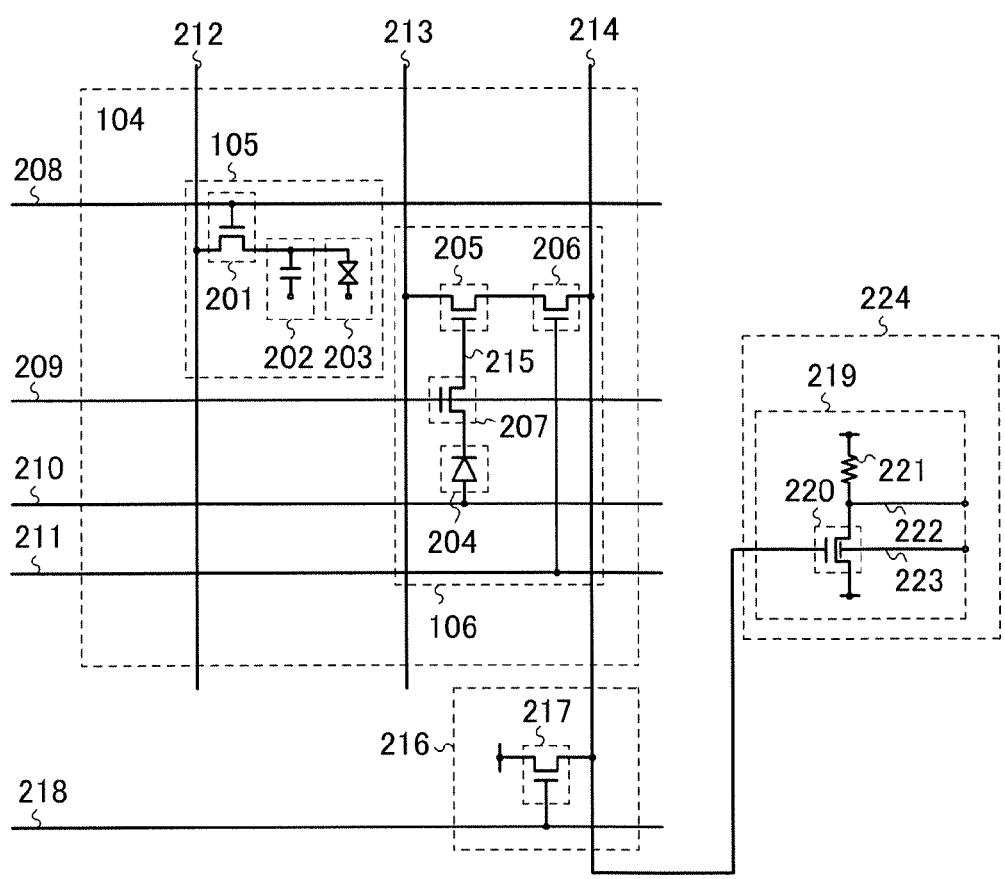
FIG. 8 is a circuit diagram showing an example of the circuit configuration of a pixel shown in FIG. 7.

Next, an example of the circuit configuration of the pixel circuit 101 will be described with reference to FIG. 8. FIG. 8 is a circuit diagram showing an example of the circuit configuration of the pixel circuit in the display device shown in FIG. 7.

The pixel circuit 101 shown in FIG. 8 includes the display circuit 105 and the photosensor 106.

The display circuit 105 includes a transistor 201, a storage capacitor 202, and a liquid crystal element 203.

The transistor 201 has a gate electrically connected to a gate line (also referred to as a scan line) 208, and a first terminal electrically connected to a video data line (also referred to as a source line) 212. The transistor 201 has a function of controlling injection and release of charge into/from the storage capacitor 202 and the liquid crystal element 203 (also referred to as charging and discharging of the storage capacitor 202 and the liquid crystal element 203). For example, when the transistor 201 is turned on, the voltage of the video data line 212 is applied to the storage capacitor 202 and the liquid crystal element 203. The transistor 201 can be a transistor having a semiconductor layer formed using amorphous silicon, microcrystalline silicon, polycrystalline silicon, or the like. For example, when the transistor 201 is a transistor having an oxide semiconductor layer that serves as a channel formation layer and having an extremely low off-state current, display quality can be increased.

The storage capacitor 202 is an element having a pair of electrodes and a dielectric layer formed between the pair of electrodes. One of the pair of electrodes is electrically connected to a second terminal of the transistor 201 and a constant voltage is applied to the other electrode. The storage capacitor 202 has a function of holding charge corresponding to a voltage applied to the liquid crystal element 203. Note that the storage capacitor 202 is not necessarily provided.

The liquid crystal element 203 is an element having a pair of electrodes and a liquid crystal layer formed between the pair of electrodes. One of the pair of electrodes is electrically connected to the second terminal of the transistor 201 and a constant voltage is applied to the other electrode. The constant voltage may be either the same as or different from a voltage applied to the other electrode of the storage capacitor 202. The liquid crystal element 203 is an element in which the polarization direction is changed by voltage application. The liquid crystal element 203 adjusts the amount of light passing therethrough by utilizing the change in polarization direction and thus produces contrast (gray scale), thereby achieving image display. Light passing through the liquid crystal element 203 is, for example, light emitted by a light source (a backlight) on the back surface of the display device.

Although the display circuit 105 described here includes the liquid crystal element 203, the display circuit 105 may include other elements such as a light-emitting element. The light-emitting element is an element whose luminance is controlled with current or voltage. Examples of the light-emitting element are a light-emitting diode and an OLED (organic light-emitting diode).

The photosensor 106 corresponds to the photoelectric conversion circuit included in the semiconductor circuit of Embodiment 2 and includes a photodiode 204, a transistor 205, a transistor 206, and a transistor 207.

The photodiode 204 has an anode and a cathode. The anode is electrically connected to the photodiode reset line 210.

The transistor 205 has a first terminal electrically connected to a photosensor reference line 213. The transistor 205 can be a transistor having a semiconductor layer formed using amorphous silicon, microcrystalline silicon, polycrystalline silicon, or single crystal silicon, for example. It is still preferable that the transistor 205 be a transistor having a semiconductor layer formed using single crystal silicon and having a high mobility, for example, because the transistor 205 has a function of amplifying a voltage generated by the photodiode 204. In addition, although the transistor 205 shown in FIG. 8 is an n-type transistor, the conductivity type thereof is not limited to this; the display device of this embodiment can include a p-type transistor as the transistor 205.

The transistor 206 has a first terminal electrically connected to a second terminal of the transistor 205, a second terminal electrically connected to a photosensor output line 214, and a gate electrically connected to a gate line 211. The transistor 206 can be a transistor having a semiconductor layer formed using amorphous silicon, microcrystalline silicon, polycrystalline silicon, or single crystal silicon, for example. It is still preferable that the transistor 206 be a transistor with high mobility having a semiconductor layer formed using single crystal silicon, for example, because the transistor 206 has a function of controlling application of an output signal of the photosensor 106 to the photosensor output line 214.

The transistor 207 has a first terminal electrically connected to the cathode of the photodiode 204, a second terminal electrically connected to a gate of the transistor 205, and a gate electrically connected to a gate line 209. The transistor 207 has a function of controlling whether or not charge corresponding to an output signal of the photodiode 204 is held at the gate of the transistor 205 as charge capacitance. The transistor 207 also has a function of holding the charge capacitance, and thus needs to be a transistor with high mobility and extremely low off-state current. For this reason, the transistor 207 is preferably a transistor having an oxide semiconductor layer serving as a channel formation layer.

The display circuit controller circuit 102 shown in FIG. 7 is a circuit for controlling the display circuits 105 and includes: a display circuit driver circuit 107 that inputs signals to the display circuits 105 through the video data lines 212; and a display circuit driver circuit 108 that inputs signals to the display circuits 105 through the gate lines 208. For example, the display circuit driver circuit 108 for controlling the voltage of the gate lines 208 has a function of selecting the display circuits 105 included in the pixels 101 placed in a certain row. The display circuit driver circuit 107 for controlling the voltage of the video data lines 212 has a function of applying a predetermined voltage to the selected display circuits 105 included in the pixel circuits 101 placed in the certain row. Note that when the transistors 201 in the display circuits 105 are turned on by the display circuit driver circuit 108, a voltage applied to the video data lines 212 is applied to the liquid crystal elements 203 in the display circuits 105 by the display circuit driver circuit 107 for controlling the voltage of the video data lines 212.

The photosensor controller circuit 103 is a circuit for controlling the photosensors 106 and includes: a photosensor reading circuit 109 for controlling the voltage of signal lines such as the photosensor output lines 214 and the photosensor reference lines 213; and a photosensor driver circuit 110 for controlling the voltage of signal lines such as the gate lines 209 and the gate lines 211. The photosensor driver circuit 110 has a function of performing a reset operation, a holding operation, and a selecting operation on the photosensors 106 included in the pixels 101 placed in a certain row. The photosensor reading circuit 109 has a function of taking output signals of the selected photosensors 106 included in the pixels 101 placed in the certain row.

Next, a precharge circuit and an A/D converter circuit used in the photosensor reading circuit 109 will be described with reference to FIG. 8.

The photosensor reading circuit 109 includes a precharge circuit 216 and an A/D converter circuit 224, as shown in FIG. 8.

One precharge circuit 216 is provided for a column of pixels, for example. The precharge circuit 216 includes a transistor 217 and a precharge line 218.

In the precharge circuit 216, a reference voltage Vref is inputted to a first terminal of the transistor 217, a second terminal of the transistor 217 is electrically connected to the photosensor output line 214, and a gate of the transistor 217 is electrically connected to the precharge line 218. Note that the precharge circuits 216 set the voltage of the photosensor output lines 214 to the reference voltage Vref prior to the operation of the photosensors 106 included in the pixel circuits 101. For example, it is possible to set the voltage of the photosensor output lines 214 to the reference voltage Vref by turning on the transistors 217. Note that the value of the reference voltage Vref is set as appropriate. In addition, providing a storage capacitor to the photosensor output line 214 is effective in stabilizing the voltage of the photosensor output line 214.

The A/D converter circuit 224 corresponds to the A/D converter circuit included in the semiconductor circuit of Embodiment 1. One A/D converter circuit 224 is provided for a column of pixels. The A/D converter circuit 224 includes a comparator 219 to which a signal is inputted through the photosensor output line 214.

The comparator 219 includes a transistor 220, a resistor 221, a comparator output line 222, and a back gate line 223. Elements included in the comparator 219 are only one transistor and one resistor. Such a configuration of the comparator 219 simplifies the circuit configuration of the A/D converter circuit 224, thereby reducing the manufacturing cost of the display device.

In the comparator 219, the transistor 220 has a source, a drain, a first gate, and a second gate. A first terminal of the transistor 220 is electrically connected to the resistor 221 and the high supply voltage Vdd is applied to the first terminal of the transistor 220 through the resistor 221. The low supply voltage Vss is applied to a second terminal of the transistor 220. Further, the first gate of the transistor 220 is electrically connected to the photosensor output line 214. In other words, the first gate of the transistor 220 is electrically connected to the second terminal of the transistor 206. Furthermore, the first terminal of the transistor 220 is electrically connected to an A/D conversion controller circuit through the comparator output line 222. The A/D conversion controller circuit can be the A/D conversion controller circuit included in the semiconductor circuit in Embodiment 1. The second gate of the transistor 220 is electrically connected to a D/A converter. The D/A converter can be the D/A converter included in the semiconductor circuit in Embodiment 1. Moreover, the D/A converter is electrically connected to the A/D conversion controller circuit. As an example, the transistor 220 shown in FIG. 8 is an n-type transistor.

The transistor 220 is a transistor the threshold voltage of which can be changed by changing the voltage of a back gate (the second gate) by a control signal inputted through the back gate line 223. Such a transistor being a bottom-gate transistor, for example, can be easily achieved by forming a conductive layer overlapping with a channel formation region with an insulating layer therebetween and processing the conductive layer into a bottom gate. Here, as an example, the transistor 220 is a transistor the threshold voltage of which is reduced by increasing the potential of a back gate and increased by reducing the potential of the back gate. Further, the transistor 220 can be a transistor having a low off-state current. The transistor having a low off-state current can be, for example, a transistor having an oxide semiconductor layer serving as a channel formation layer.

The comparator 219 uses the photosensor output line 214 as an input line. The comparator 219 outputs a voltage the value of which is equivalent to that of the low supply voltage Vss to the comparator output line 222 when the voltage of the photosensor output line 214 is higher than the threshold voltage of the transistor 220, and outputs a voltage the value of which is equivalent to that of the high supply voltage Vdd to the comparator output line 222 when the voltage of the photosensor output line 214 is lower than the threshold voltage of the transistor 220. Here, the voltage of the comparator output line 222 is changed from a high voltage to a low voltage by gradually increasing the voltage of the back gate line 223 while leaving the voltage of the photosensor output line 214 constant. It is therefore possible to determine the value of the voltage of the photosensor output line 214 by sequentially applying a voltage that varies successively to the back gate line 223 and by obtaining the voltage of the comparator output line 222. A signal inputted through the photosensor output line 214 can be converted into a digital signal by expressing the voltage determined here with a digital value.

The A/D converter circuit included in the semiconductor circuit of Embodiment 1 is applicable to the A/D converter circuit 224.

Next, an example of the operation of the display device shown in FIG. 7 and FIG. 8 will be described.

An example of the operation of the display device shown in FIG. 7 and FIG. 8 is divided mainly into a display operation and a read operation. Each operation will be described below.

The display operation is as follows: video signals are sequentially inputted to the selected pixels through the video data lines 212, a voltage is then applied to the liquid crystal elements 203 included in the display circuits 105 in accordance with data of the inputted video signals, and the liquid crystal elements 203 perform the display operation in accordance with the applied voltage.

Next, an example of the read operation with the photosensor in the display device shown in FIG. 7 and FIG. 8 will be described with reference to FIG. 9. FIG. 9 is a timing diagram for describing an example of the read operation performed by the photosensor in the display device shown in FIG. 7 and FIG. 8. In FIG. 9, a signal 301 represents the voltage of the photodiode reset line 210 (also referred to as V210) in FIG. 8, a signal 302 represents the voltage of the gate line 209 (also referred to as V209), a signal 303 represents the voltage of the gate line 211 (also referred to as V211), a signal 304 represents the voltage of the gate line 215 (also referred to as V215), a signal 305 represents the voltage of the photosensor output line 214 (also referred to as V214), a signal 306 represents the voltage of the precharge line 218 (also referred to as V218), a signal 307 represents the voltage of the comparator output line 222 (also referred to as V222), and a signal 308 represents the voltage of the back gate line 223 (also referred to as V223). Note that here, as an example, the transistor 205, the transistor 206, the transistor 207, and the transistor 220 are n-type transistors; the transistor 217 is a p-type transistor; the signal 301, the signal 302, the signal 303, the signal 306, and the signal 308 are high-level or low-level binary digital signals; a high-level voltage signal is inputted to the photosensor reference line 213; and a high-level voltage signal is inputted to the first terminal of the transistor 217. Note that the voltage of the high-level signal is "H" (also referred to as voltage H), and the voltage of the low-level signal is "L" (also referred to as voltage L).

First, at a time TA, which is the start of the reset operation, when the voltage of the photodiode reset line 210 (the signal 301) is "H" and the voltage of the gate line 209 (the signal 302) is "H", the photodiode 204 goes into a conduction state and the voltage of the gate line 215 (the signal 304) becomes "H". Further, when the voltage of the precharge line 218 (the signal 306) is "L", the voltage of the photosensor output line 214 (the signal 305) is precharged at "H". Note that the voltage of the back gate line 223 (the signal 308) is a first comparison voltage (a voltage corresponding to a digital value "11").

Next, at a time TB, which is the end of the reset operation or the start of the holding operation, when the voltage of the photodiode reset line 210 (the signal 301) is "L" and the voltage of the gate line 209 (the signal 302) remains to be "H", the voltage of the gate line 215 (the signal 304) starts to be reduced by the off-state current of the photodiode 204. The off-state current of the photodiode 204 increases when light enters the photodiode 204. Consequently, the voltage of the gate line 215 (the signal 304) varies in accordance with the intensity of the incident light. Thus, channel resistance between the source and the drain of the transistor 205 varies.

Next, at a time TC, which is the end of the holding operation, when the voltage of the gate line 209 (the signal 302) is "L", the value of the voltage of the gate line 215 (the signal 304) becomes a predetermined value. At the time, the voltage of the gate line 215 is determined by the amount of charge that the photodiode 204 has supplied to the gate line 215 during the holding operation. Thus, the voltage of the gate line 215 varies in accordance with the intensity of light that has entered the photodiode 204. The transistor 207 has an oxide semiconductor layer and has an extremely low off-state current, and thus is capable of holding the amount of charge in the gate line 215 until the later selecting operation starts.

Note that when the voltage of the gate line 209 (the signal 302) is "L", the voltage of the gate line 215 is changed by parasitic capacitance between the gate line 209 and the gate line 215. If the amount of the change in voltage is significant, the amount of charge that the photodiode 204 has supplied during the holding operation is not obtained accurately. Effective ways to reduce the amount of the change in voltage are to reduce the gate-source (or gate-drain) capacitance of the transistor 207, to increase the gate capacitance of the transistor 205, or to provide the gate line 215 with a storage capacitor. Note that in an example of the read operation performed by the photosensor in the display device shown in FIG. 7 and FIG. 8, which example is described with reference to FIG. 9, the change in voltage is negligibly small.

Next, at a time TD, which is the start of the selecting operation, when the voltage of the gate line 211 (the signal 303) is "H", the transistor 206 is turned on and the photosensor reference line 213 and the photosensor output line 214 are electrically connected to each other through the transistor 205 and the transistor 206. Then, the voltage of the photosensor output line 214 (the signal 305) decreases. Note that the precharge operation of the photosensor output line 214 is finished before the time TD by setting the voltage of the precharge line 218 (the signal 306) to be "H" and turning off the transistor 217. Here, the speed at which the voltage of the photosensor output line 214 (the signal 305) decreases depends on the amount of the source-drain current of the transistor 205, namely, varies in accordance with the intensity of light entering the photodiode 204 during the holding operation.

Then, at a time TE, which is the end of the selecting operation, when the voltage of the gate line 211 (the signal 303) is "L", the transistor 206 is turned off and the value of the voltage of the photosensor output line 214 (the signal 305) becomes a constant value. Here, the constant voltage varies in accordance with the intensity of light entering the photodiode 204. It is therefore possible to determine the intensity of light that has entered the photodiode 204 during the holding operation by obtaining information on the voltage of the photosensor output line 214.

Next, at a time TF, a time TG, and a time TH, the A/D conversion operation is performed in the following manner: the voltage of the back gate line 223 is sequentially changed to a second comparison voltage (a digital value "10"), followed by a third comparison voltage (a digital value "01"), and then a fourth comparison voltage (a digital value "00"). By determining a comparison voltage obtained when the voltage of the comparator output line 222 (the signal 307) changed from "H" to "L", the voltage of the photosensor output line 214 can be determined and the voltage of the photosensor output line 214 can be converted into a digital signal the digital value of which corresponds to the comparison voltage. For example, when the voltage of the comparator output line 222 at the time of the first comparison voltage is "L", the voltage of the photosensor output line 214 is converted into a signal the digital value of which is "11". For another example, when the voltage of the comparator output line 222 at the time of the third comparison voltage is "H" and the voltage of the comparator output line 222 at the time of the fourth comparison voltage is "L", the voltage of the photosensor output line 214 is converted into a digital signal the digital value of which is "00". Note that the voltage of the back gate line 223 is generated, for example, by using the A/D conversion controller circuit and the D/A converter as described in Embodiment 1.

In the timing diagram shown in FIG. 9, the voltage of the comparator output line 222 (the signal 307) changes from "H" to "L" in accordance with the third comparison voltage (a digital value "01"), so that the voltage of the photosensor output line 214 is converted into a digital signal the digital value of which is "01".

Note that although a case where an example of an A/D conversion using the comparator 219 is a two-bit A/D conversion has been described, three or more bit A/D conversion can be also performed by changing the value of the voltage applied to the back gate line 223 at shorter intervals. A/D conversion with a larger number of bits requires higher speed operation of the comparator. It is therefore preferable that the transistor 220 be a transistor with high mobility. It is also preferable that the transistor 220 be a transistor having a low off-state current in order to reduce power consumption in standby mode and suppress the variations in the voltage of the output signal of the comparator 219 due to leakage current between the source and the drain of the transistor 220. To provide both such high mobility and such low off state current, the transistor 220 is preferably a transistor using an oxide semiconductor.

As described above, the operation of each photosensor is achieved by repeating the reset operation, the holding operation, the selecting operation, and the A/D conversion operation. Image capture can be carried out by performing these operations, specifically, by repeatedly performing row-by-row a sequence of the reset operation, the holding operation, the selecting operation, and the A/D conversion operation, on all the pixels.

Note that although the display device with photosensors has been described in this embodiment, this embodiment can be easily applied also to a semiconductor circuit with photosensors. Such a semiconductor circuit can be achieved by removing circuits needed to display an image, specifically the display circuit controller circuit 102 and the display circuit 105 from the display device 100 of this embodiment.

As shown in FIG. 7, FIG. 8, and FIG. 9 as an example, an example of the display device of this embodiment includes the display circuits and the photoelectric conversion circuits in the pixel portion. Thus, it is possible to perform display operation and read operation in the pixel portion. Consequently, the display device can have any one or more of the following functions for example: a position sensing function (e.g., a function of performing, when a finger, pen, or the like touches or approaches the pixel portion, a specific operation according to a touched position); a character input/output function (e.g., a function of inputting a character with a finger, a pen, or the like and displaying the inputted character on the pixel portion); a fingerprint authentication function (e.g., a function of detecting the fingerprints of a finger touching the pixel portion); and a document input/output function (e.g., a function of reading a document or the like put on the pixel portion and displaying an image of the read document on the pixel portion).

An example of the display device of this embodiment is the A/D converter circuit with the comparator circuit using the transistor the threshold voltage of which changes successively by using a control signal. Thus, the circuit configuration of the A/D converter circuit can be simplified. Further, it is possible to improve the resolution used in converting light entering the photosensor during an image capturing operation into a signal because the threshold voltage of the transistor used in the comparator circuit can be set freely.

Note that this embodiment can be combined with or replaced by any of the other embodiments as appropriate.

(Embodiment 4)

In this embodiment, an example of a transistor applicable to the semiconductor circuit of Embodiments 1 and 2 and the display device of Embodiment 3 will be described.

An example of the transistor applicable to the semiconductor circuit of Embodiments 1 and 2 and the display device of Embodiment 3 is a transistor having an oxide semiconductor layer serving as a channel formation layer. The oxide semiconductor layer serving as a channel formation layer in the transistor is a semiconductor layer that is highly purified and thus is intrinsic (i-type) or substantially intrinsic.

To highly purify means at least one of the following concepts: to remove hydrogen from the oxide semiconductor layer as much as possible; and to reduce defects due to oxygen deficiency in an oxide semiconductor layer by supplying oxygen to the oxide semiconductor layer.

Examples of an oxide semiconductor used in the oxide semiconductor layer are a four-component metal oxide, a three-component metal oxide, and a two-component metal oxide. An example of the four-component metal oxide is an In—Sn—Ga—Zn—O-based metal oxide. Examples of the three-component metal oxide are an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, and a Sn—Al—Zn—O-based metal oxide. Examples of the two-component metal oxide are an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, and an In—Sn—O-based metal oxide. Other examples of the oxide semiconductor are an In—O-based metal oxide, a Sn—O-based metal oxide, and a Zn—O-based metal oxide. Still another example of the oxide semiconductor is an oxide that includes the above-mentioned metal oxide that can be used as the above oxide semiconductor and $SiO_2$.

A material represented by $InMO_3(ZnO)_m$ (m>0) can be used as the oxide semiconductor. Here, M represents one or more metal elements selected from Ga, Al, Mn, and Co. Examples of M are Ga, Ga and Al, Ga and Mn, and Ga and Co. Of oxide semiconductors having the composition formula $InMO_3(ZnO)_m$(m>0), an oxide semiconductor that contains Ga as M, for example, is referred to as the In—Ga—Zn—O-based oxide semiconductor.

The band gap of the oxide semiconductor layer is 2 eV or more, preferably 2.5 eV or more, more preferably 3 eV or more. Thus, the number of carriers generated by thermal excitation can be negligible. Further, the amount of impurity, such as hydrogen, that might act as a donor is reduced to less than or equal to a certain amount so that the carrier concentration may be less than $1\times10^{14}/cm^3$, preferably $1\times10^{12}/cm^3$ or less. In other words, the carrier concentration of the oxide semiconductor layer is made as close as possible to zero or is made substantially zero.

The above-described oxide semiconductor layer is resistant to avalanche breakdown and has a high breakdown voltage. Silicon has a band gap of as small as 1.12 eV, and thus tends to cause avalanche-like generation of electrons, called avalanche breakdown, leading to the increase in the number of electrons which are so accelerated that they can break through a barrier to a gate insulating layer. In contrast, an oxide semiconductor used for the above-described oxide semiconductor layer has a band gap of as wide as 2 eV or more, and thus is resistant to avalanche breakdown. This oxide semiconductor also has higher resistance to hot-carrier degradation than silicon, and thus has a high breakdown voltage.

Hot-carrier degradation refers, for example, to degradation of transistor characteristics due to fixed charges caused by the fact that highly-accelerated electrons are injected, in a channel and in the vicinity of a drain, into a gate insulating film; and to degradation of transistor characteristics or the like due to a trap level or the like formed by highly-accelerated electrons at the interface between an oxide semiconductor layer and a gate insulating layer. Examples of degradation of transistor characteristics are variations in threshold voltage and gate leakage. Hot-carrier degradation is caused by channel-hot-electron injection (CHE injection) or drain-avalanche-hot-carrier injection (DAHC injection), for example.

Note that the band gap of silicon carbide, which is one of materials having a high breakdown voltage, is substantially equal to that of the oxide semiconductor used for the above-described oxide semiconductor layer, but the mobility of electrons in the oxide semiconductor is lower than that of silicon carbide by approximately two orders of magnitude, and electrons are therefore less likely to be accelerated in the oxide semiconductor. Further, a barrier between the gate insulating layer and the oxide semiconductor is larger than a barrier between the gate insulating layer and any of silicon carbide, gallium nitride, and silicon. This means that the oxide semiconductor leads to an extremely small number of electrons injected into the gate insulating layer; has higher resistance to hot-carrier degradation than silicon carbide, gallium nitride, or silicon; and has a high breakdown voltage. In addition, the oxide semiconductor has a high breakdown voltage even when being amorphous.

In a transistor having the above-described oxide semiconductor layer, the off-state current per micrometer of channel width can be 10 aA ($1\times10^{-17}$ A) or less, 1 aA ($1\times10^{-18}$ A) or less, 10 zA ($1\times10^{-20}$ A) or less, or 1 zA ($1\times10^{-21}$ A) or less.

Note that the transistor in the semiconductor circuit of Embodiments 1 and 2 and the display device of Embodiment 3 is not limited to a transistor with the above-described structure, and may be, for example, a transistor using an amorphous semiconductor such as amorphous silicon, a microcrystalline semiconductor such as microcrystalline silicon, a polycrystalline semiconductor such as polysilicon, or a single crystal semiconductor such as single crystal silicon. In the semiconductor circuit or display device of Embodiments 1 to 3, it is possible to select and use as appropriate a transistor with a suitable structure for a needed function.

Examples of the structure of the transistor of this embodiment will be further described with reference to FIGS. 10A to 10D and FIGS. 11A to 11D. FIGS. 10A to 10D and FIGS. 11A to 11D are cross-sectional schematic views showing examples of the structure of the transistor of this embodiment.

Figure 10A:
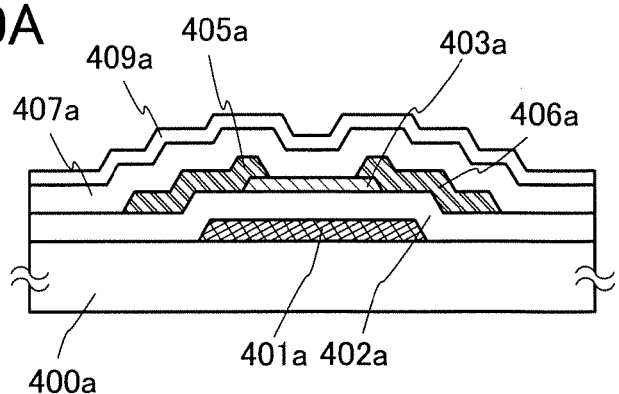
FIGS. 10A to 10D are cross-sectional schematic views showing examples of the structure of a transistor of Embodiment 4.

A transistor shown in FIG. 10A is a bottom-gate transistor and is also an inverted staggered transistor.

The transistor shown in FIG. 10A includes a conductive layer 401a serving as a gate electrode, an insulating layer 402a serving as a gate insulating layer, an oxide semiconductor layer 403a serving as a channel formation layer, a conductive layer 405a serving as one of a source electrode and a drain electrode, and a conductive layer 406a serving as the other of the source electrode and the drain electrode.

The conductive layer 401a is formed over a substrate 400a, the insulating layer 402a is formed over the conductive layer 401*a*, the oxide semiconductor layer 403*a* is formed over the conductive layer 401*a* with the insulating layer 402*a* interposed therebetween, and the conductive layer 405*a* and the conductive layer 406*a* are each formed over part of the oxide semiconductor layer 403*a*. The conductive layer 401*a* can overlap with the whole oxide semiconductor layer 403*a*. When the conductive layer 401*a* overlaps with the whole oxide semiconductor layer 403*a*, light entering the oxide semiconductor layer 403*a* can be suppressed. The structure thereof is not limited to this; the conductive layer 401*a* can overlap with part of the oxide semiconductor layer 403*a*.

In the transistor illustrated in FIG. 10A, an oxide insulating layer 407*a* is in contact with part of an upper surface of the oxide semiconductor layer 403*a* (part of the upper surface over which the conductive layer 405*a* and the conductive layer 406*a* are not provided). In addition, a protective insulating layer 409*a* is formed over the oxide insulating layer 407*a*.

Figure 11A:
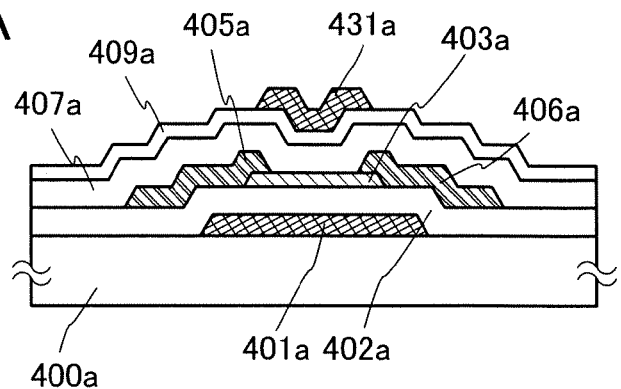
FIGS. 11A to 11D are cross-sectional schematic views showing examples of the structure of a transistor of Embodiment 4.

As shown in FIG. 11A, the transistor in the semiconductor circuit of Embodiments 1 and 2 and the display device of Embodiment 3 can be a transistor that is the same as the transistor shown in FIG. 10A except that a conductive layer 431*a* is formed over the oxide semiconductor layer 403*a* with the oxide insulating layer 407*a* and the protective insulating layer 409*a* interposed therebetween. The conductive layer 431*a* serves as a gate electrode. The transistor shown in FIG. 11A is a transistor the threshold voltage of which is controlled by the gate electrode formed using the conductive layer 401*a* or the conductive layer 431*a*. The conductive layer 431*a* can overlap with the whole oxide semiconductor layer 403*a*. When the conductive layer 431*a* overlaps with the whole oxide semiconductor layer 403*a*, light entering the oxide semiconductor layer 403*a* can be suppressed. The structure thereof is not limited to this; the conductive layer 431*a* can overlap with part of the oxide semiconductor layer 403*a*.

Figure 10B:
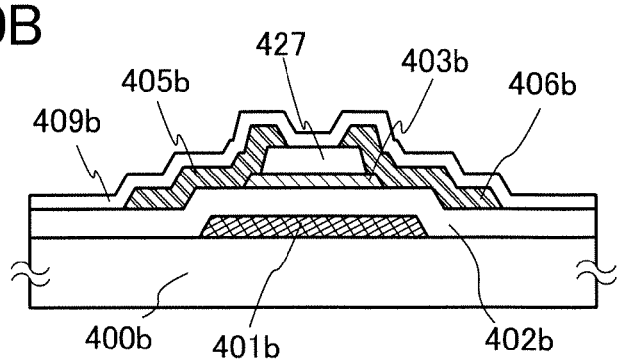

A transistor shown in FIG. 10B is a bottom-gate transistor called a channel-protective (channel-stop) transistor and is also an inverted staggered transistor.

The transistor shown in FIG. 10B includes a conductive layer 401*b* serving as a gate electrode, an insulating layer 402*b* serving as a gate insulating layer, an oxide semiconductor layer 403*b* serving as a channel formation layer, an insulating layer 427 serving as a channel protecting layer, a conductive layer 405*b* serving as one of a source electrode and a drain electrode, and a conductive layer 406*b* serving as the other of the source electrode and the drain electrode.

The conductive layer 401*b* is formed over a substrate 400*b*, the insulating layer 402*b* is formed over the conductive layer 401*b*, the oxide semiconductor layer 403*b* is formed over the conductive layer 401*b* with the insulating layer 402*b* interposed therebetween, the insulating layer 427 is formed over the conductive layer 401*b* with the insulating layer 402*b* and the oxide semiconductor layer 403*b* interposed therebetween, and the conductive layer 405*b* and the conductive layer 406*b* are formed over part of the oxide semiconductor layer 403*b* with the insulating layer 427 interposed therebetween. The conductive layer 401*b* can overlap with the whole oxide semiconductor layer 403*b*. When the conductive layer 401*b* overlaps with the whole oxide semiconductor layer 403*b*, light entering the oxide semiconductor layer 403*b* can be suppressed. The structure thereof is not limited to this; the conductive layer 401*b* can overlap with part of the oxide semiconductor layer 403*b*.

Further, a protective insulating layer 409*b* is in contact with an upper part of the transistor shown in FIG. 10B.

Figure 11B:
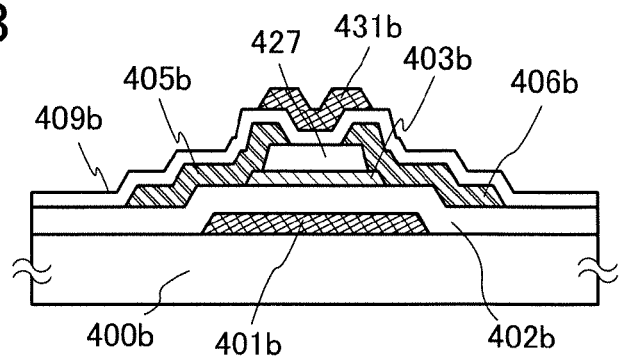

As shown in FIG. 11B, the transistor in the semiconductor circuit of Embodiments 1 and 2 and the display device of Embodiment 3 can be a transistor that is the same as the transistor shown in FIG. 10B except that a conductive layer 431*b* is formed over the oxide semiconductor layer 403*b* with the protective insulating layer 409*b* interposed therebetween. The conductive layer 431*b* serves as a gate electrode. The transistor shown in FIG. 11B is a transistor the threshold voltage of which is controlled by the gate electrode formed using the conductive layer 401*b* or the conductive layer 431*b*. The conductive layer 431*b* can overlap with the whole oxide semiconductor layer 403*b*. When the conductive layer 431*b* overlaps with the whole oxide semiconductor layer 403*b*, light entering the oxide semiconductor layer 403*b* can be suppressed. The structure thereof is not limited to this; the conductive layer 431*b* can overlap with part of the oxide semiconductor layer 403*b*.

Figure 10C:
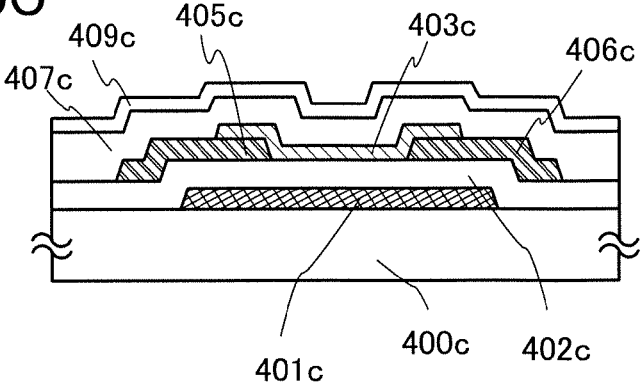

A transistor shown in FIG. 10C is a bottom-gate transistor.

The transistor shown in FIG. 10C includes a conductive layer 401*c* serving as a gate electrode, an insulating layer 402*e* serving as a gate insulating layer, an oxide semiconductor layer 403*c* serving as a channel formation layer, a conductive layer 405*c* serving as one of a source electrode and a drain electrode, and a conductive layer 406*c* serving as the other of the source electrode and the drain electrode.

The conductive layer 401*c* is formed over a substrate 400*c*, the insulating layer 402*c* is formed over the conductive layer 401*c*, the conductive layer 405*e* and the conductive layer 406*e* are formed over part of the insulating layer 402*c*, and the oxide semiconductor layer 403*e* is formed over the conductive layer 401*c* with the insulating layer 402*e*, the conductive layer 405*c*, and the conductive layer 406*c* interposed therebetween. The conductive layer 401*c* can overlap with the whole oxide semiconductor layer 403*c*. When the conductive layer 401*c* overlaps with the whole oxide semiconductor layer 403*c*, light entering the oxide semiconductor layer 403*c* can be suppressed. The structure thereof is not limited to this; the conductive layer 401*c* can overlap with part of the oxide semiconductor layer 403*c*.

Further in the transistor shown in FIG. 10C, an oxide insulating layer 407*c* is in contact with an upper surface and a side surface of the oxide semiconductor layer 403*c*. In addition, a protective insulating layer 409*c* is formed over the oxide insulating layer 407*c*.

Figure 11C:
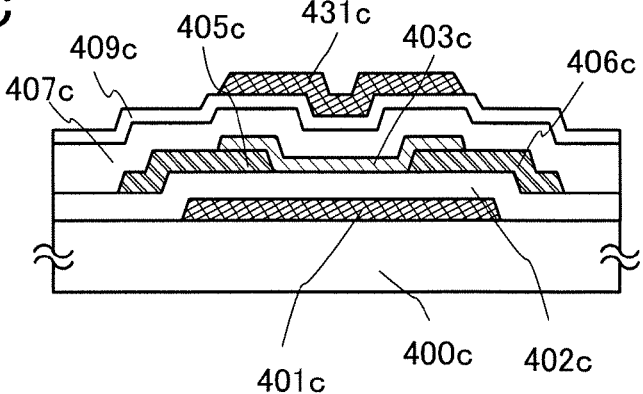

As shown in FIG. 11C, an example of the transistor applicable to the semiconductor circuit of Embodiments 1 and 2 and the display device of Embodiment 3 can be a transistor that is the same as the transistor shown in FIG. 10C except that a conductive layer 431*c* is formed over the oxide semiconductor layer 403*c* with the oxide insulating layer 407*c* and the protective insulating layer 409*c* interposed therebetween. The conductive layer 431*c* serves as a gate electrode. The transistor shown in FIG. 11C is a transistor the threshold voltage of which is controlled by the gate electrode formed using the conductive layer 401*c* or the conductive layer 431*c*. The conductive layer 431*c* can overlap with the whole oxide semiconductor layer 403*c*. When the conductive layer 431*c* overlaps with the whole oxide semiconductor layer 403*c*, light entering the oxide semiconductor layer 403*c* can be suppressed. The structure thereof is not limited to this; the conductive layer 431*c* can overlap with part of the oxide semiconductor layer 403*c*.

Figure 10D:
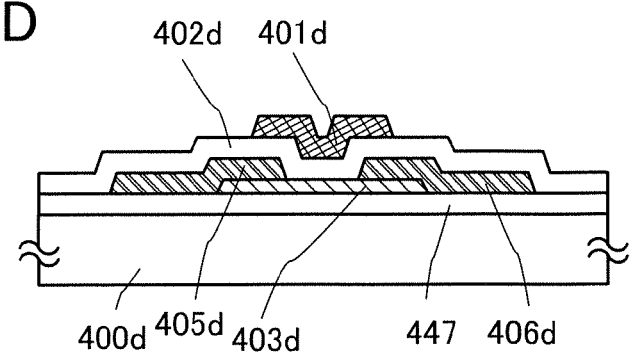

A transistor shown in FIG. 10D is a top-gate transistor.

The transistor shown in FIG. 10D includes a conductive layer 401*d* serving as a gate electrode, an insulating layer 402*d* serving as a gate insulating layer, an oxide semiconductor layer 403*d* serving as a channel formation layer, a conductive layer 405*d* serving as one of a source electrode and a drain electrode, and a conductive layer 406d serving as the other of the source electrode and the drain electrode.

The oxide semiconductor layer 403d is formed over a substrate 400d with an insulating layer 447 interposed therebetween, the conductive layer 405d and the conductive layer 406d are each formed over part of the oxide semiconductor layer 403d, the insulating layer 402d is formed over the oxide semiconductor layer 403d, the conductive layer 405d, and the conductive layer 406d, and the conductive layer 401d is formed over the oxide semiconductor layer 403d with the insulating layer 402d interposed therebetween.

Figure 11D:
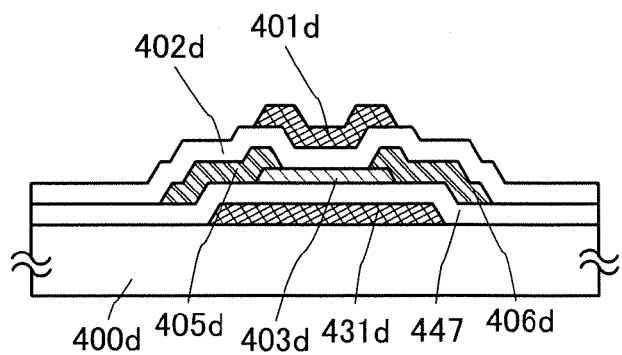

As shown in FIG. 11D, an example of the transistor applicable to the semiconductor circuit of Embodiments 1 and 2 and the display device of Embodiment 3 can be a transistor that is the same as the transistor shown in FIG. 10D except that a conductive layer 431d is formed over the oxide semiconductor layer 403d with the insulating layer 447 interposed therebetween. The conductive layer 431d serves as a gate electrode, and the insulating layer 447 serves as a gate insulating layer. The transistor shown in FIG. 11D is a transistor the threshold voltage of which is controlled by the gate electrode formed using the conductive layer 401d or the conductive layer 431d. The conductive layer 431d can overlap with the whole oxide semiconductor layer 403d. When the conductive layer 431d overlaps with the whole oxide semiconductor layer 403d, light entering the oxide semiconductor layer 403d can be suppressed. The structure thereof is not limited to this; the conductive layer 431d can overlap with part of the oxide semiconductor layer 403d.

Each of the substrates 400a to 400d can be, for example, a glass substrate of barium borosilicate glass or aluminoborosilicate glass.

Alternatively, each of the substrates 400a to 400d can be a substrate of an insulator, such as a ceramic substrate, a quartz substrate, or a sapphire substrate. Alternatively, each of the substrates 400a to 400d can be crystallized glass substrate. Alternatively, each of the substrates 400a to 400d can be a plastic substrate. Alternatively, each of the substrates 400a to 400d can be a semiconductor substrate of silicon or the like.

The insulating layer 447 serves as a base layer preventing diffusion of an impurity element from the substrate 400d. The insulating layer 447 can be, for example, a silicon nitride layer, a silicon oxide layer, a silicon nitride oxide layer, a silicon oxynitride layer, an aluminum oxide layer, or an aluminum oxynitride layer. Alternatively, the insulating layer 447 can be a stack of layers each using any of the materials applicable to the insulating layer 447. Alternatively, the insulating layer 447 can be a stack of a layer using a light-blocking material and a layer using any of the above materials applicable to the insulating layer 447. When the insulating layer 447 is formed using a layer using a light-blocking material, light entering the oxide semiconductor layer 403d can be suppressed.

Note that in each of the transistors shown in FIGS. 10A to 10C and FIGS. 11A to 11D, like the transistor shown in FIG. 10D, an insulating layer may be formed between the substrate and the conductive layer serving as a gate electrode.

Each of the conductive layers 401a to 401d can be, for example, a layer of a metal material such as molybdenum, titanium, chromium, tantalum, tungsten, aluminum, copper, neodymium, or scandium; or an alloy material containing any of these materials as a main component. Alternatively, each of the conductive layers 401a to 401d can be a stack of layers of any of the materials applicable to the conductive layers 401a to 401d.

Each of the insulating layers 402a to 402d can be, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer. Alternatively, each of the insulating layers 402a to 402d can be a stack of any of the materials applicable to the insulating layers 402a to 402d. The layers of any of the materials applicable to the insulating layers 402a to 402d can be formed by plasma enhanced CVD or sputtering, for example. For example, the insulating layers 402a to 402d can be formed in the following manner: a silicon nitride layer is formed by plasma enhanced CVD, and a silicon oxide layer is formed over the silicon nitride layer by plasma enhanced CVD.

Examples of an oxide semiconductor that can be used in the oxide semiconductor layers 403a to 403d are a four-component metal oxide, a three-component metal oxide, and a two-component metal oxide. An example of the four-component metal oxide is an In—Sn—Ga—Zn—O-based metal oxide. Examples of the three-component metal oxide are an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide. Examples of the two-component metal oxide are an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—Sn—O-based metal oxide. Examples of the oxide semiconductor are an In—O-based metal oxide, a Sn—O-based metal oxide, and a Zn—O-based metal oxide. Another example of the above oxide semiconductor is an oxide that includes any of the above metal oxides that can be used as the above oxide semiconductor and $SiO_2$. Here, for example, the In—Ga—Zn—O-based metal oxide means an oxide containing at least In, Ga, and Zn, and the composition ratio of the elements is not particularly limited. The In—Ga—Zn—O-based metal oxide may contain an element other than the In, Ga, and Zn.

An example of an oxide semiconductor applicable to the oxide semiconductor layers 403a to 403d is a metal oxide represented by a chemical formula $InMO_3(ZnO)_m$ (m is larger than 0). Here, M represents one or more metal elements selected from Ga, Al, Mn, and Co. M can be Ga, Ga and Al, Ga and Mn, or Ga and Co, for example.

Each of the conductive layers 405a to 405d and the conductive layers 406a to 406d can be, for example, a layer of a metal material such as aluminum, chromium, copper, tantalum, titanium, molybdenum, or tungsten; or an alloy material containing any of these metal materials as a main component. Alternatively, each of the conductive layers 405a to 405d and the conductive layers 406a to 406d can be a stack of layers of the materials applicable to the conductive layers 405a to 405d and the conductive layers 406a to 406d.

Each of the conductive layers 405a to 405d and the conductive layers 406a to 406d can be, for example, a stack of a metal layer of aluminum or copper and a high-melting-point metal layer of titanium, molybdenum, or tungsten. Alternatively, each of the conductive layers 405a to 405d and the conductive layers 406a to 406d can be a stack in which a metal layer of aluminum or copper is formed between a plurality of high-melting-point metal layers. Each of the conductive layers 405a to 405d and the conductive layers 406a to 406d can have an improved heat resistance when being an aluminum layer to which an element that prevents hillocks or whiskers (e.g., Si, Nd, or Si) is added.

Alternatively, each of the conductive layers 405a to 405d and the conductive layers 406a to 406d can be a layer containing a conductive metal oxide. Examples of the conductive metal oxide are indium oxide ($In_2O_3$), tin oxide ($SnO_2$), zinc oxide (ZnO), an alloy of indium oxide and tin oxide ($In_2O_3$—$SnO_2$, abbreviated as ITO), an alloy of indium oxide and zinc oxide ($In_2O_3$—ZnO), or any of these metal oxide materials containing silicon oxide.

In addition, another wiring may be formed using a material used to form the conductive layers 405a to 405d and the conductive layers 406a to 406d.

The insulating layer 427 can be, for example, a layer using any of the materials applicable to the insulating layer 447. Alternatively, the insulating layer 427 can be a stack of layers of any of the materials applicable to the insulating layer 427.

The oxide insulating layer 407a and the oxide insulating layer 407c each can be an oxide insulating layer e.g., a silicon oxide layer. Alternatively, the oxide insulating layer 407a and the oxide insulating layer 407c each can be a stack of layers of any of the materials applicable to the oxide insulating layer 407a and the oxide insulating layer 407c.

Each of the protective insulating layers 409a to 409c can be, for example, an inorganic insulating layer e.g., a silicon nitride layer, an aluminum nitride layer, a silicon nitride oxide layer, or an aluminum nitride oxide layer. Alternatively, each of the protective insulating layers 409a to 409c can be a stack of layers of any of the materials applicable to the protective insulating layers 409a to 409c.

Each of the conductive layers 431a to 431d can be, for example, a layer of a metal material such as aluminum, chromium, copper, tantalum, titanium, molybdenum, or tungsten; or an alloy material which contains any of the above metal materials as a main component. Alternatively, each of the conductive films 431a to 431d can be a layer containing a conductive metal oxide. Examples of the conductive metal oxide are indium oxide ($In_2O_3$), tin oxide ($SnO_2$), zinc oxide (ZnO), an alloy of indium oxide and tin oxide ($In_2O_3$—$SnO_2$, abbreviated as ITO), an alloy of indium oxide and zinc oxide ($In_2O_3$—ZnO), or any of these metal oxide materials containing silicon oxide. Alternatively, each of the conductive layers 431a to 431d can be a stack of layers of any of the materials applicable to the conductive layers 431a to 431d.

In the semiconductor circuit of Embodiments 1 and 2 and the display circuit of Embodiment 3, in order to reduce surface unevenness due to the transistor of this embodiment, a planarization insulating layer can be formed over the transistor (over the transistor with the oxide insulating layer or the protective insulating layer interposed therebetween if the transistor includes an oxide insulating layer or a protective insulating layer). The planarization insulating layer can be a layer of an organic material such as polyimide, acrylic, or benzocyclobutene. Alternatively, the planarization insulating layer can be a layer of a low-dielectric constant material (also referred to as a low-k material). Alternatively, the planarization insulating layer can be a stack of layers of any of the materials applicable to the planarization insulating layer.

Next, as an example of the fabrication method of the transistor of this embodiment, an example of a fabrication method of the transistor shown in FIG. 10A and FIG. 11A will be described with reference to FIGS. 12A to 12C and FIGS. 13A to 13C. FIGS. 12A to 12C and FIGS. 13A to 13C are cross-sectional schematic views showing an example of the fabrication method of the transistor shown in FIG. 10A and FIG. 11A.

First, the substrate 400a is prepared, and a first conductive film is formed over the substrate 400a.

Note that the substrate 400a is a glass substrate, for example.

The first conductive film can be, for example, a film of a metal material such as molybdenum, titanium, chromium, tantalum, tungsten, aluminum, copper, neodymium, or scandium; or an alloy material that contains any of the metal materials as a main component. Alternatively, the first conductive film can be a stack of layers of any of the materials applicable to the first conductive film.

Next, a first photolithography process is carried out in the following manner: a first resist mask is formed over the first conductive film, the first conductive film is selectively etched with the use of the first resist mask to form the conductive layer 401a, and the first resist mask is removed.

In this embodiment, the resist mask may be formed by an ink-jet method. Formation of the resist mask by an inkjet method needs no photomask, thereby leading to a reduction in manufacturing cost.

In order to reduce the number of photomasks and steps in the photolithography process, etching may be performed using a resist mask formed by a multi-tone mask. A multi-tone mask is a light-exposure mask such that light transmitted through the mask has a plurality of intensities. A resist mask made by a multi-tone mask has a plurality of thicknesses and can be further changed in shape by etching; thus, such a resist mask can be used in a plurality of etching processes for different patterns. Consequently, a resist mask applicable to at least two or more kinds of different patterns can be made by a single multi-tone mask. This makes it possible to reduce the number of exposure masks and also the number of corresponding photolithography processes, thereby simplifying the process.

Next, the insulating layer 402a is formed over the conductive layer 401a.

The insulating layer 402a can be formed, for example, by high-density plasma enhanced CVD. High-density plasma enhanced CVD using microwaves (e.g., microwaves with a frequency of 2.45 GHz), for example, enables an insulating layer to be dense and to have a high breakdown voltage and high quality, and thus is preferable. When the high-quality insulating layer formed by high-density plasma enhanced CVD is in contact with the oxide semiconductor layer, the interface state therebetween can be reduced and favorable interface properties can be obtained.

The insulating layer 402a can also be formed by another method such as sputtering or plasma enhanced CVD. Further, heat treatment may be performed after the formation of the insulating layer 402a. This heat treatment can improve the quality of the insulating layer 402a and interface characteristics between the insulating layer 402a and the oxide semiconductor.

Next, an oxide semiconductor film 530 with a thickness ranging from 2 nm to 200 nm, preferably from 5 nm to 30 nm is formed over the insulating layer 402a. The oxide semiconductor film 530 can be formed, for example, by sputtering.

Note that before the formation of the oxide semiconductor film 530, powdery substances (also referred to as particles or dust) on a surface of the insulating layer 402a are preferably removed by reverse sputtering in which an argon gas is introduced and plasma is generated. The reverse sputtering refers to a method in which, without application of a voltage to a target, a voltage is applied to a substrate with an RF power source in an argon atmosphere so that plasma is generated in the vicinity of the substrate to modify a surface. Note that instead of an argon atmosphere, nitrogen, helium, oxygen, or the like may be used.

Figure 12A:
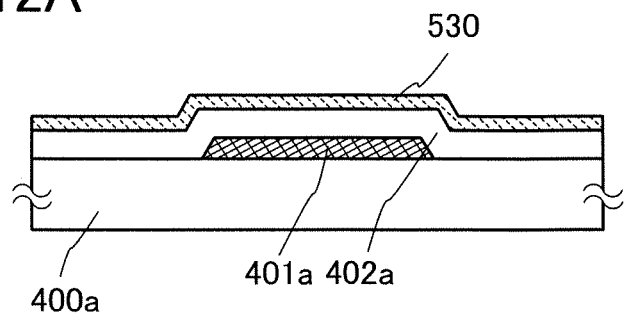
FIGS. 12A to 12C are cross-sectional schematic views showing an example of the fabrication method of the transistor of Embodiment 4.
Figure 12B:
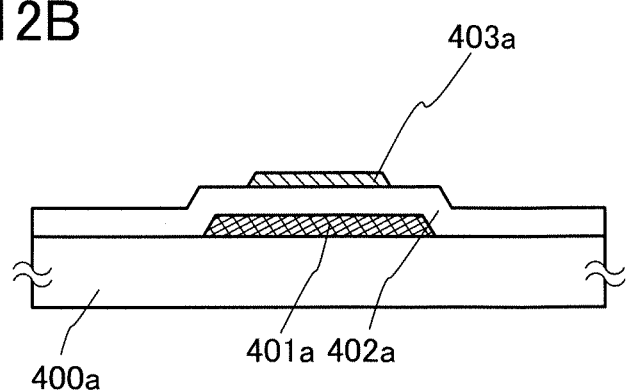

For example, the oxide semiconductor film 530 can be formed using an oxide semiconductor material that can be used as a material for the oxide semiconductor layer 403a. In this embodiment, the oxide semiconductor film 530 is formed, for example, by sputtering with the use of an In—Ga—Zn—O-based oxide target. A cross-sectional schematic view of this stage is shown in FIG. 12A. Alternatively, the oxide semiconductor film 530 can be formed by sputtering in a rare gas (typically, argon) atmosphere, an oxygen atmosphere, or a mixed atmosphere of a rare gas and oxygen.

A target for forming the oxide semiconductor film 530 by sputtering can be, for example, an oxide target having a composition ratio of $In_2O_3:Ga_2O_3:ZnO=1:1:1$ [molar ratio]. The target used is not limited to the above-described target and may be, for example, an oxide target having a composition ratio of $In_2O_3:Ga_2O_3:ZnO=1:1:2$ [molar ratio]. The proportion of the volume of a portion except an area occupied by a space and the like with respect to the total volume of the oxide target (also referred to as the filling percentage) is 90% to 100%, and preferably 95% to 99.9%. The oxide semiconductor film formed using a metal oxide target having a high filling percentage has high density.

For example, a high-purity gas from which an impurity such as hydrogen, water, hydroxyl, or hydride is removed is preferably used as a sputtering gas used in the formation of the oxide semiconductor film 530.

It is preferable that before the formation of the oxide semiconductor film 530, the substrate 400a over which the conductive layer 401a is formed or the substrate 400a over which the conductive layer 401a and the insulating layer 402a are formed be preheated in a preheating chamber of the sputtering apparatus, and an impurity such as hydrogen or moisture on the substrate 400a be released and exhausted. The preheating can prevent hydrogen, hydroxyl, and moisture from entering the insulating layer 402a and the oxide semiconductor film 530. Note that a cryopump is preferable as an exhaustion unit provided in the preheating chamber. Note that this preheating treatment may be omitted. The preheating may be similarly performed before the formation of the oxide insulating layer 407a, on the substrate 400a over which layers up to the conductive layer 405a and the conductive layer 406a have been formed.

When the oxide semiconductor film 530 is formed by sputtering, the substrate 400a is held inside a film formation chamber kept in a reduced pressure state, and substrate temperatures are set in the range of 100° C. to 600° C., and preferably 200° C. to 400° C. By heating the substrate 400a, the concentration of an impurity contained in the oxide semiconductor film 530 can be reduced and damage to the oxide semiconductor film 530 due to the sputtering can be reduced. Then, a sputtering gas from which hydrogen and moisture are removed is introduced while remaining moisture in the film formation chamber is removed, and the oxide semiconductor film 530 is formed over the insulating layer 402a with the use of the above-described target.

In order to remove remaining water in the film formation chamber, an entrapment vacuum pump such as a cryopump, an ion pump, or a titanium sublimation pump is preferably used. Further, an exhaustion unit may be a turbo pump to which a cold trap is added. In the case where the film formation chamber is exhausted with a cryopump, a hydrogen atom, a compound containing a hydrogen atom such as water, further preferably, a compound containing a hydrogen atom and a carbon atom, or the like is removed. For this reason, the use of a cryopump makes it possible to reduce the concentration of an impurity contained in the oxide semiconductor film 530 that is formed in the film formation chamber.

An example of the film formation conditions is as follows: the distance between the substrate and the target is 100 mm, the pressure is 0.6 Pa, the direct-current (DC) power is 0.5 kW, and the atmosphere is an oxygen atmosphere (the proportion of the oxygen flow is 100%). Note that the use of a pulse direct-current power supply makes it possible to reduce powdery substances that occur at the time of film formation and make the film thickness uniform.

Next, a second photolithography process is carried out in the following manner: a second resist mask is formed over the oxide semiconductor film 530, the oxide semiconductor film 530 is selectively etched with the use of the second resist mask to process the oxide semiconductor film 530 into an island-shaped oxide semiconductor layer, and the second resist mask is removed.

In the case of forming a contact hole in the insulating layer 402a, the contact hole can be formed at the time of processing the oxide semiconductor film 530 into the island-shaped oxide semiconductor layer.

The oxide semiconductor film 530 can be etched, for example, by dry etching, wet etching, or both dry etching and wet etching. An etchant for wet etching of the oxide semiconductor film 530 can be, for example, a mixed solution of phosphoric acid, acetic acid, and nitric acid; or ITO07N (produced by KANTO CHEMICAL CO., INC.).

Next, the oxide semiconductor layer is subjected to first heat treatment. The first heat treatment allows the oxide semiconductor layer to be dehydrated or dehydrogenated. Temperatures in the first heat treatment are in the range of 400° C. to 750° C., or 400° C. or more and lower than the strain point of the substrate. Here, the substrate is put in an electric furnace that is a kind of heat treatment apparatus and heat treatment is performed on the oxide semiconductor layer in a nitrogen atmosphere at 450° C. for one hour. After that, the oxide semiconductor layer is prevented from being exposed to the air and from containing water or hydrogen again. Thus, the oxide semiconductor layer 403a is obtained (see FIG. 12B).

The heat treatment apparatus is not limited to the electric furnace and may be the one provided with a device for heating an object using heat conduction or heat radiation from a heating element such as a resistance heating element. The heat treatment apparatus can be, for example, an RTA (rapid thermal annealing) apparatus such as a GRTA (gas rapid thermal annealing) apparatus or an LRTA (lamp rapid thermal annealing) apparatus. An LRTA apparatus is, for example, an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. The high temperature gas can be, for example, an inert gas that does not react with an object by heat treatment, such as nitrogen or a rare gas like argon.

The first heat treatment may be, for example, GRTA performed in the following manner: the substrate is transferred and put in an inert gas heated to 650° C. to 700° C., then heated for several minutes, and transferred and taken out of the heated inert gas.

Note that it is preferable that in the first heat treatment, water, hydrogen, and the like be not contained in nitrogen or a rare gas such as helium, neon, or argon. Further, it is preferable that nitrogen or a rare gas such as helium, neon, or argon introduced into the heat treatment apparatus have a purity of 6N (99.9999%) or more, and preferably 7N (99.99999%) or more, that is, have an impurity concentration of 1 ppm or less, and preferably, 0.1 ppm or less.

After the oxide semiconductor layer is heated by the first heat treatment, a high-purity oxygen gas, a high-purity $N_2O$ gas, or ultra-dry air (an atmosphere with a dew point of −40° C. or less, preferably −60° C. or less) may be introduced into the furnace that has been used in the first heat treatment. It is preferable that the oxygen gas or the $N_2O$ gas do not contain water, hydrogen, and the like. Further it is preferable that the oxygen gas or the $N_2O$ gas that is introduced into the heat treatment apparatus have a purity of 6N or more, and preferably 7N or more, that is, have an impurity concentration of 1 ppm or less, and preferably 0.1 ppm or less. By the effect of the oxygen gas or the $N_2O$ gas, oxygen, which has been reduced through the step of eliminating an impurity by the dehydration or dehydrogenation treatment, is supplied; thus, the oxide semiconductor layer 403a is highly purified.

The first heat treatment can also be performed on the oxide semiconductor film 530 not yet been processed into the island-shaped oxide semiconductor layer. In such a case, the substrate is taken out of the heating apparatus after the first heat treatment and then the oxide semiconductor film 530 is processed into the island-shaped oxide semiconductor layer.

In addition to at the above-described timings, the first heat treatment may be performed, as long as it is performed after the formation of the oxide semiconductor layer, after the conductive layer 405a and the conductive layer 406a are formed over the oxide semiconductor layer 403a or after the oxide insulating layer 407a is formed over the conductive layer 405a and the conductive layer 406a.

In the case of forming a contact hole in the insulating layer 402a, the contact hole may be formed before the first heat treatment is performed.

The oxide semiconductor layer may be formed using an oxide semiconductor film that is formed through two deposition steps and two heat treatments so as to be a thick film including a crystalline region (a single crystal region), that is, a crystalline region having c-axes aligned in a direction perpendicular to a surface of the film, regardless of the material for a base component such as an oxide, a nitride, a metal, or the like. For example, a first oxide semiconductor film with a thickness ranging from 3 nm to 15 nm is deposited and subjected to the first heat treatment at temperatures in the range of 450° C. to 850° C., and preferably 550° C. to 750° C. under an atmosphere of nitrogen, oxygen, a rare gas, or dry air, to have a crystalline region (including a plate-like crystal) in a region including a surface. Then, a second oxide semiconductor film that is thicker than the first oxide semiconductor film is formed and subjected to the second heat treatment at temperatures in the range of 450° C. to 850° C., and preferably 600° C. to 700° C., so that crystal growth proceeds toward the upper side i.e., from the first oxide semiconductor film to the second oxide semiconductor film using the first oxide semiconductor film as a seed of the crystal growth and the entire region of the second oxide semiconductor film is crystallized. This means that the oxide semiconductor layer 403a may be formed using a thick oxide semiconductor film including a crystalline region.

Next, a second conductive film is formed over the insulating layer 402a and the oxide semiconductor layer 403a.

The second conductive film can be, for example, a film of a metal material such as aluminum, chromium, copper, tantalum, titanium, molybdenum, or tungsten; or an alloy material which contains any of these metal materials as a main component. Alternatively, the second conductive film can be a stack of films of any of the materials applicable to the second conductive film.

Figure 12C:
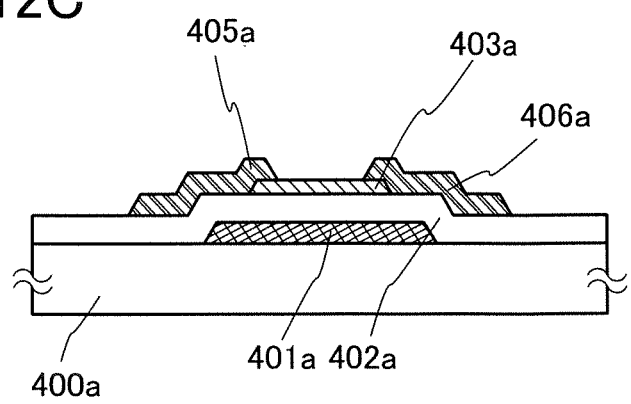

Next, a third photolithography process is carried out in the following manner: a third resist mask is formed over the third conductive film, the third conductive film is selectively etched with the use of the third resist mask to form the conductive layer 405a and the conductive layer 406a, and the third resist mask is removed (see FIG. 12C).

Note that another wiring may be formed using the third conductive film at the time of forming the conductive layer 405a and the conductive layer 406a.

Light exposure used to form the third resist mask preferably uses ultraviolet light, KrF laser light, or ArF laser light. The channel length L of the transistor to be formed later depends on the width of an interval between a bottom end of the conductive layer 405a and a bottom end of the conductive layer 406a over the oxide semiconductor layer 403a. In the case where the channel length L is less than 25 nm, the light exposure used to form the third resist mask is preferably performed using extreme ultraviolet light having an extremely short wavelength of several nanometers to several tens of nanometers. Light exposure using extreme ultraviolet light offers high resolution and a large depth of focus. Therefore, the channel length L of the transistor to be formed later can be 10 nm to 1000 nm. The use of such a transistor formed through the above-described light exposure enables the circuit to operate at a higher speed and, since the off-state current of the transistor is extremely low, to consume lower power.

In the case of etching the second conductive film, etching conditions are preferably optimized in order to prevent the oxide semiconductor layer 403a from being divided by the etching. However, it is difficult to satisfy the conditions that only the second conductive film is etched and the oxide semiconductor layer 403a is not etched at all. Therefore, in some cases, only part of the oxide semiconductor layer 403a is etched at the time of the etching of the second conductive film, causing the oxide semiconductor layer 403a to have a groove (a depression).

In this embodiment, an example of the second conductive film is a titanium film, and an example of the oxide semiconductor layer 403a is an In—Ga—Zn—O-based oxide semiconductor. For this reason, an etchant used in this embodiment is an ammonia hydrogen peroxide solution (a mixture of ammonia, water, and a hydrogen peroxide solution).

Next, the oxide insulating layer 407a is formed over the oxide semiconductor layer 403a, the conductive layer 405a, and the conductive layer 406a. Here, the oxide insulating layer 407a is in contact with part of the upper surface of the oxide semiconductor layer 403a.

The oxide insulating layer 407a can be formed to a thickness of at least 1 nm or more using as appropriate a method by which an impurity such as water or hydrogen is not introduced into the oxide insulating layer 407a, such as sputtering. The mixing of hydrogen into the oxide insulating layer 407a may cause the entry of the hydrogen to the oxide semiconductor layer, or extraction of oxygen in the oxide semiconductor layer due to the hydrogen, thereby causing the back-channel of the oxide semiconductor layer to have lower resistance (to be of the n-type conductivity) and a parasitic channel to be thus formed. It is therefore important to employ a method that does not use hydrogen as a fabrication method of the oxide insulating layer 407a in order that the oxide insulating layer 407a may contain as little hydrogen as possible.

In this embodiment, a 200-nm-thick silicon oxide film is formed by sputtering as an example of the oxide insulating layer 407a. The substrate temperature at the time of the film formation may be higher than or equal to room temperature and lower than or equal to 300° C.; in this embodiment, the substrate temperature is 100° C. as an example. The formation of a silicon oxide film by sputtering can be performed in a rare gas (typically, argon) atmosphere, an oxygen atmosphere, or a mixed atmosphere of a rare gas and oxygen.

A silicon oxide target or a silicon target, for example, can be used as a target for forming the oxide insulating layer 407a. For example, with the use of a silicon target, a silicon oxide film can be formed by sputtering under an atmosphere containing oxygen.

In order to remove remaining water in a film formation chamber that is used for forming the oxide insulating layer 407a, an entrapment vacuum pump, for example, such as a cryopump is preferably used. By removing remaining water in a film formation chamber with a cryopump, the concentration of an impurity contained in the oxide insulating layer 407a can be reduced. A turbo pump provided with a cold trap can be used as an exhaustion unit for removing remaining water in the film formation chamber that is used for forming the oxide insulating layer 407a.

A sputtering gas used in the formation of the oxide insulating layer 407a is preferably a high-purity gas from which an impurity such as hydrogen, water, hydroxyl, or hydride is removed.

Before the formation of the oxide insulating layer 407a, plasma treatment using a gas such as $N_2O$, $N_2$, or Ar may be performed to remove water or the like on an exposed surface of the oxide semiconductor layer 403a. In the case where plasma treatment is performed, the oxide insulating layer 407a which is in contact with part of the upper surface of the oxide semiconductor layer 403a is preferably formed without exposure to the air.

Then, second heat treatment (preferably, at temperatures in the range of 200° C. to 400° C. e.g., 250° C. to 350° C.) can be performed in an inert gas atmosphere or in an oxygen gas atmosphere. For example, the second heat treatment is performed at 250° C. in a nitrogen atmosphere for one hour. By the second heat treatment, part of the upper surface of the oxide semiconductor layer 403a is heated while being in contact with the oxide insulating layer 407a.

In the above-described process, the first heat treatment is performed on the oxide semiconductor film, allowing an impurity such as hydrogen, moisture, hydroxyl group, or hydride (also referred to as a hydrogen compound) to be intentionally removed from the oxide semiconductor layer, and oxygen to be supplied to the oxide semiconductor layer. Thus, the oxide semiconductor layer is highly purified.

Figure 13A:
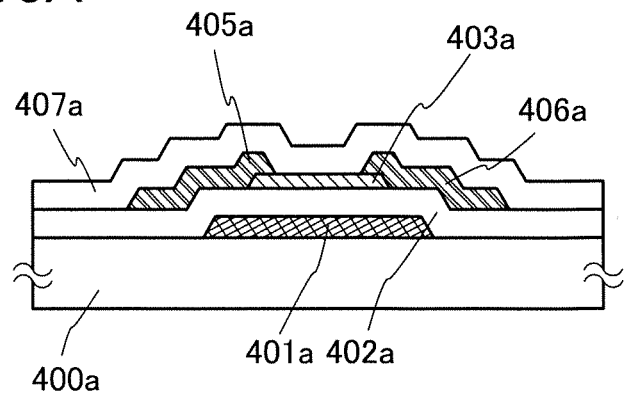
FIGS. 13A to 13C are cross-sectional schematic views showing an example of the fabrication method of the transistor of Embodiment 4.
Figure 13B:
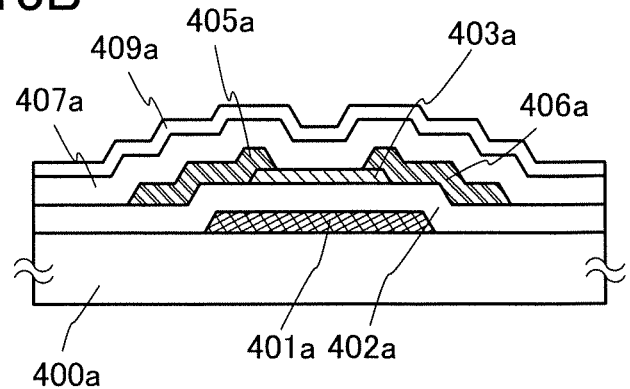

The above-described process allows the transistor to be formed (see FIG. 13A).

When the oxide insulating layer 407a is a silicon oxide layer having many defects, an impurity such as hydrogen, moisture, hydroxyl group, or hydride contained in the oxide semiconductor layer 403a is diffused into the oxide insulating layer 407a by the heat treatment performed after the formation of the silicon oxide layer, producing the effect that the impurity contained in the oxide semiconductor layer 403a is reduced.

The protective insulating layer 409a may be further formed over the oxide insulating layer 407a. For example, a silicon nitride film is formed by RF sputtering. The RF sputtering is preferable for the formation method of the protective insulating layer 409a because it achieves high mass productivity. In this embodiment, a silicon nitride film, for example, is formed to be the protective insulating layer 409a (see FIG. 13B).

In this embodiment, the protective insulating layer 409a is formed in the following manner: the substrate 400a over which layers up to the oxide insulating layer 407a are formed is heated to temperatures in the range of 100° C. to 400° C. and a silicon nitride film is formed with the use of a target of a silicon semiconductor and a sputtering gas containing high-purity nitrogen from which hydrogen and moisture are removed. In this case also, the protective insulating layer 409a is preferably formed while removing remaining moisture in a treatment chamber, similarly to the oxide insulating layer 407a.

After formation of the protective insulating layer 409a, heat treatment may be further performed at temperatures in the range of 100° C. to 200° C. under the air for 1 to 30 hours. This heat treatment may be performed at a constant heating temperature or follow temperature cycles where the temperature repeatedly rises from room temperature to a heating temperature in the range of 100° C. to 200° C. and drops from the heating temperature to room temperature. This is an example of the fabrication method of the transistor shown in FIG. 10A.

Further, to form the transistor shown in FIG. 11A, a fourth conductive film is formed over the protective insulating layer 409a.

The fourth conductive film can be, for example, a film of a metal material such as aluminum, chromium, copper, tantalum, titanium, molybdenum, or tungsten; or an alloy material containing any of these metal materials as a main component. Alternatively, the fourth conductive film can be a film containing a conductive metal oxide. Examples of the conductive metal oxide are indium oxide ($In_2O_3$), tin oxide ($SnO_2$), zinc oxide (ZnO), an alloy of indium oxide and tin oxide ($In_2O_3$—$SnO_2$, abbreviated as ITO), an alloy of indium oxide and zinc oxide ($In_2O_3$—ZnO), or any of these metal oxide materials containing silicon oxide. Alternatively, each of the conductive layers 431a to 431d can be a stack of layers of any of the materials applicable to the conductive layers 431a to 431d. Alternatively, the fourth conductive film can be a stack of films of any of the materials applicable to the fourth conductive film.

Figure 13C:
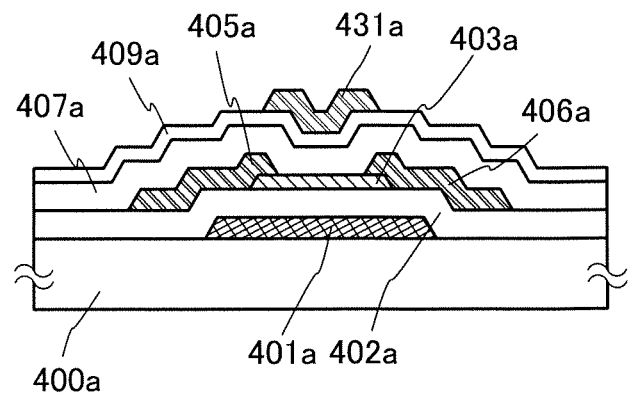

Next, a fourth photolithography process is carried out in the following manner: a fourth resist mask is formed over the fourth conductive film, the fourth conductive film is selectively etched with the use of the fourth resist mask to form the conductive layer 431a, and the fourth resist mask is removed (see FIG. 13C). This is an example of the fabrication process of the transistor shown in FIG. 10A.

An example of the fabrication method of the transistor shown in FIG. 10D will be described with reference to FIGS. 14A to 14D. FIGS. 14A to 14D are cross-sectional schematic views showing an example of the fabrication method of the transistor shown in FIG. 10D.

First, the substrate 400d is prepared, and the insulating layer 447 is formed over the substrate 400d.

Note that the substrate 400d is a glass substrate, for example.

The insulating layer 447 can be formed, for example, by plasma enhanced CVD or sputtering. When the insulating layer 447 is formed, for example, by sputtering, the hydrogen concentration in the insulating layer 447 can be reduced.

In the case where the insulating layer 447 is formed using any of the above-described methods, the insulating layer 447 is preferably formed while removing remaining moisture in a treatment chamber. This is in order to prevent the insulating layer 447 from containing hydrogen, a hydroxyl group, or moisture.

Note that in order to remove moisture remaining in the process chamber, an entrapment vacuum pump is preferably used. The entrapment vacuum pump is preferably a cryopump, an ion pump, or a titanium sublimation pump, for example. An exhaustion unit can be, for example, a turbo pump to which a cold trap is added. In a deposition chamber which is exhausted with the cryopump, a hydrogen atom or a compound containing a hydrogen atom (water or the like), for example, is removed, thereby reducing the concentration of an impurity (particularly hydrogen) contained in the insulating layer 447 formed in the deposition chamber.

Note that in the case of forming the insulating layer 447, the substrate 400*d* may be heated.

For example, in the case where a stack of a silicon nitride layer and a silicon oxide layer is formed to be the insulating layer 447, the silicon nitride layer and the silicon oxide layer can be formed in the same treatment chamber with the same silicon target. First, a sputtering gas containing nitrogen is introduced and a silicon target placed inside the treatment chamber is used to form the silicon nitride layer, and then, the sputtering gas is switched to a sputtering gas containing oxygen and the same silicon target is used to form the silicon oxide layer. This enables the silicon nitride layer and the silicon oxide layer to be formed without being exposed to the air in succession, an impurity such as hydrogen or moisture can be prevented from being on a surface of the silicon nitride layer.

Then, an oxide semiconductor film with a thickness of 2 nm to 200 nm is formed over the insulating layer 447.

In order for the oxide semiconductor film not to contain an impurity such as hydrogen, a hydroxyl group, or moisture as much as possible, it is preferable to perform pretreatment of film formation in the following manner: the substrate 400*d*, over which the insulating layer 447 is formed, is preheated in a preheating chamber of the sputtering apparatus so that an impurity such as hydrogen or moisture on the substrate 400*d* is released and exhausted. Note that a preferable exhaustion unit provided in the preheating chamber is a cryopump, for example. Note that this preheating treatment can be omitted.

Note that before the oxide semiconductor film is formed, reverse sputtering in which an argon gas is introduced and plasma is generated may be performed.

For example, the oxide semiconductor film can be formed using an oxide semiconductor material that can be used as a material for the oxide semiconductor layer 403*d*. In this embodiment, the oxide semiconductor film is formed, for example, by sputtering with the use of an In—Ga—Zn—O-based oxide target. Alternatively, the oxide semiconductor film can be formed by sputtering in a rare gas (typically, argon) atmosphere, an oxygen atmosphere, or a mixed atmosphere of a rare gas and oxygen.

A target for forming the oxide semiconductor film by sputtering can be, for example, an oxide target having a composition ratio of $In_2O_3:Ga_2O_3:ZnO=1:1:1$ [molar ratio]. The target used is not limited to the above-described target and may be, for example, an oxide target having a composition ratio of $In_2O_3:Ga_2O_3:ZnO=1:1:2$ [molar ratio]. The proportion of the volume of a portion except an area occupied by a space and the like with respect to the total volume of the oxide target (also referred to as the filling percentage) is 90% to 100%, and preferably 95% to 99.9%. The oxide semiconductor film formed using a metal oxide target having a high filling percentage has high density.

A sputtering gas used in the formation of the oxide semiconductor film is preferably a high-purity gas from which an impurity such as hydrogen, water, hydroxyl, or hydride is removed.

In this embodiment, as an example, the substrate is held in the treatment chamber kept under reduced pressure, a sputtering gas from which hydrogen and moisture are removed is introduced into the treatment chamber from which remaining moisture is being removed, and the oxide semiconductor film is formed over the substrate 400*d* by using a metal oxide as a target. In order to remove moisture remaining in the process chamber, an entrapment vacuum pump is preferably used. The entrapment vacuum pump is preferably a cryopump, an ion pump, or a titanium sublimation pump, for example. An exhaustion unit can be a turbo pump to which a cold trap is added. In a deposition chamber which is exhausted with the cryopump, a hydrogen atom, a compound containing a hydrogen atom, such as water ($H_2O$), (more preferably, also a compound containing a carbon atom), and the like are removed, thereby reducing the concentration of an impurity (particularly hydrogen) contained in the insulating layer 447 formed in the deposition chamber. The substrate may be heated at the time of the film formation of the oxide semiconductor film.

An example of the film formation conditions is as follows: the distance between the substrate and the target is 60 mm, the pressure is 0.4 Pa, the direct-current (DC) power is 0.5 kW, and the atmosphere is an atmosphere of oxygen and argon (the flow ratio of oxygen to argon is 15 sccm: 30 sccm). Note that the use of a pulse direct-current power supply makes it possible to reduce powdery substances that occur at the time of film formation and make the film thickness uniform.

Next, a first photolithography process is carried out in the following manner: a first resist mask is formed over the oxide semiconductor film, the oxide semiconductor film is selectively etched with the use of the first resist mask to process the oxide semiconductor film into the island-shaped oxide semiconductor layer 403*d*, and the first resist mask is removed (see FIG. 4A).

The oxide semiconductor film can be etched, for example, by dry etching, wet etching, or both dry etching and wet etching. An etchant for wet etching of the oxide semiconductor film can be, for example, a mixed solution of phosphoric acid, acetic acid, and nitric acid; or ITO07N (produced by KANTO CHEMICAL CO., INC.).

Next, the oxide semiconductor layer 403*d* is subjected to first heat treatment. Temperatures in the first heat treatment are in the range of 400° C. to 750° C., and are preferably 400° C. or more and lower than the strain point of the substrate. Here, the substrate is put in an electric furnace that is a kind of heat treatment apparatus and heat treatment is performed on the oxide semiconductor layer in a nitrogen atmosphere at 450° C. for one hour. After that, the oxide semiconductor layer 403*d* is prevented from being exposed to the air and from containing water or hydrogen again.

The heat treatment apparatus is not limited to the electric furnace and may be the one provided with a device for heating an object using heat conduction or heat radiation from a heating element such as a resistance heating element. The heat treatment apparatus can be, for example, an RTA (rapid thermal annealing) apparatus such as a GRTA (gas rapid thermal annealing) apparatus or an LRTA (lamp rapid thermal annealing) apparatus. An LRTA apparatus is, for example, an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. The high temperature gas can be, for example, an inert gas that does not react with an object by heat treatment, such as nitrogen or a rare gas like argon.

The first heat treatment may be, for example, GRTA performed in the following manner: the substrate is transferred and put in an inert gas heated to 650° C. to 700° C., then heated for several minutes, and transferred and taken out of the heated inert gas.

Note that it is preferable that in the first heat treatment, water, hydrogen, and the like be not contained in nitrogen or a rare gas such as helium, neon, or argon. Further, it is preferable that nitrogen or a rare gas such as helium, neon, or argon introduced into the heat treatment apparatus have a purity of 6N (99.9999%) or more, and preferably 7N (99.99999%) or more, that is, have an impurity concentration of 1 ppm or less, and preferably, 0.1 ppm or less.

After the oxide semiconductor layer 403d is heated by the first heat treatment, a high-purity oxygen gas, a high-purity $N_2O$ gas, or ultra-dry air (an atmosphere with a dew point of −40° C. or less, preferably −60° C. or less) may be introduced into the furnace that has been used in the first heat treatment. It is preferable that the oxygen gas or the $N_2O$ gas do not contain water, hydrogen, and the like. Further it is preferable that the oxygen gas or the $N_2O$ gas that is introduced into the heat treatment apparatus have a purity of 6N or more, and preferably 7N or more, that is, have an impurity concentration of 1 ppm or less, and preferably 0.1 ppm or less. By the effect of the oxygen gas or the $N_2O$ gas, oxygen, which has been reduced through the step of eliminating an impurity by the dehydration or dehydrogenation treatment, is supplied; thus, the oxide semiconductor layer 403d is highly purified.

The first heat treatment can also be performed on the oxide semiconductor layer 403d not yet been processed into the island-shaped oxide semiconductor layer. In such a case, the substrate is taken out of the heating apparatus after the first heat treatment and then the oxide semiconductor film 403d is processed into the island-shaped oxide semiconductor layer 403d.

In addition to at the above-described timings, the first heat treatment may be performed, as long as it is performed after the formation of the oxide semiconductor layer 403d, after the conductive layer 405dd and the conductive layer 406d are formed over the oxide semiconductor layer 403d or after the insulating layer 402d is formed over the conductive layer 405d and the conductive layer 406d.

The oxide semiconductor layer may be formed using an oxide semiconductor film that is formed through two deposition steps and two heat treatments so as to be a thick film including a crystalline region (a single crystal region), that is, a crystalline region having c-axes aligned in a direction perpendicular to a surface of the film, regardless of the material for a base component such as an oxide, a nitride, a metal, or the like. For example, a first oxide semiconductor film with a thickness ranging from 3 nm to 15 nm is deposited and subjected to the first heat treatment at temperatures in the range of 450° C. to 850° C., and preferably 550° C. to 750° C. under an atmosphere of nitrogen, oxygen, a rare gas, or dry air, to have a crystalline region (including a plate-like crystal) in a region including a surface. Then, a second oxide semiconductor film that is thicker than the first oxide semiconductor film is formed and subjected to the second heat treatment at temperatures in the range of 450° C. to 850° C., and preferably 600° C. to 700° C., so that crystal growth proceeds toward the upper side i.e., from the first oxide semiconductor film to the second oxide semiconductor film using the first oxide semiconductor film as a seed of the crystal growth and the entire region of the second oxide semiconductor film is crystallized. This means that the oxide semiconductor layer may be formed using a thick film including a crystalline region.

Next, a first conductive film is formed over the insulating layer 447 with the oxide semiconductor layer 403d interposed therebetween.

The first conductive film can be, for example, a film of a metal material such as aluminum, chromium, copper, tantalum, titanium, molybdenum, or tungsten; or an alloy material containing any of these metal materials as a main component. Alternatively, the first conductive film can be a stack of films of any of the materials applicable to the first conductive film.

Figure 14A:
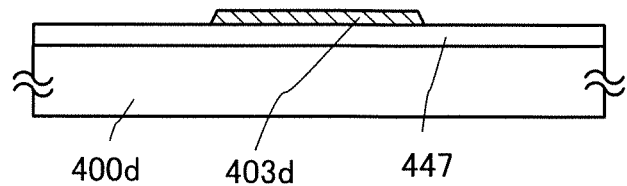
FIGS. 14A to 14D are cross-sectional views showing an example of the fabrication method of the transistor of Embodiment 4.
Figure 14B:
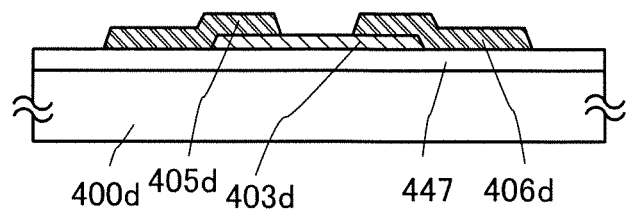

Next, a second photolithography process is carried out in the following manner: a second resist mask is formed over the first conductive film, the first conductive film is selectively etched with the use of the second resist mask to form the conductive layers 405d and 406d, and the second resist mask is removed (see FIG. 14B).

In this embodiment, the first conductive film is a titanium film, for example.

Note that in order to prevent the oxide semiconductor layer 403d from being removed and the insulating layer 447 therebelow from being exposed at the time of the etching of the first conductive film, each material and etching conditions are adjusted as appropriate.

In the case of etching the first conductive film, etching conditions are preferably optimized in order to prevent the oxide semiconductor layer 403d from being divided by the etching. However, it is difficult to satisfy the conditions that only the first conductive film is etched and the oxide semiconductor layer 403d is not etched at all. Therefore, in some cases, only part of the oxide semiconductor layer 403d is etched at the time of the etching of the first conductive film, causing the oxide semiconductor layer 403d to have a groove (a depression).

Light exposure used to form the second resist mask preferably uses ultraviolet light, KrF laser light, or ArF laser light. The channel length L of the transistor to be formed later depends on the width of an interval between a bottom end of the conductive layer 405d and a bottom end of the conductive layer 406d over the oxide semiconductor layer 403d. In the case where the channel length L is less than 25 nm, the light exposure used to form the third resist mask is preferably performed using extreme ultraviolet light having an extremely short wavelength of several nanometers to several tens of nanometers.

Figure 14C:
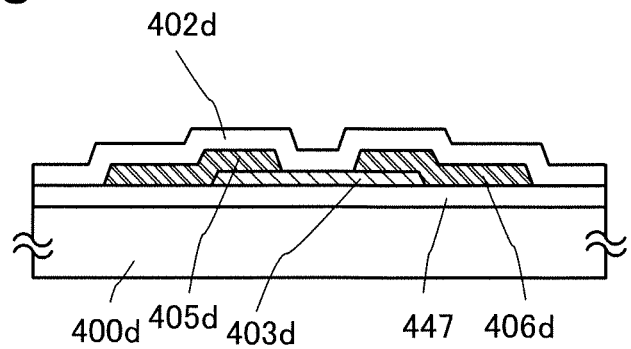

Next, the insulating layer 402d is formed over the oxide semiconductor layer 403d, the conductive layer 405d, and the conductive layer 406d (see FIG. 14C).

The insulating layer 402d can be formed, for example, by plasma enhanced CVD or sputtering. When the insulating layer 402d is formed, for example, by sputtering, the hydrogen concentration in the insulating layer 402d can be reduced.

In this embodiment, a 100-nm-thick silicon oxide layer serving as an example of the insulating layer 402d is formed by RF sputtering in an atmosphere containing oxygen and argon (the flow ratio of oxygen to argon is 25 sccm: 25 sccm=1:1), under conditions where the pressure is 0.4 Pa and the high-frequency power source of 1.5 kW is used.

Then, a second conductive film is formed over the insulating layer 402d.

The second conductive film can be, for example, a film of a metal material such as molybdenum, titanium, chromium, tantalum, tungsten, aluminum, copper, neodymium, or scandium; or an alloy material containing any of these materials as a main component. Alternatively, the second conductive film can be a stack of films of any of the materials applicable to the second conductive film.

Figure 14D:
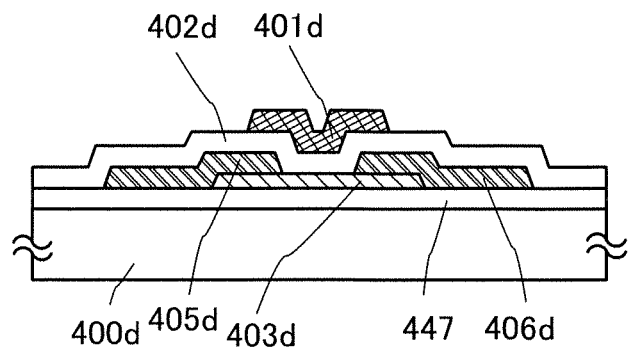

Next, a third photolithography process is carried out in the following manner: a third resist mask is formed over the second conductive film, the second conductive film is selectively etched with the use of the third resist mask to form the conductive layer 401d, and the third resist mask is removed (see FIG. 14D).

Then, second heat treatment (preferably, at temperatures in the range of 200° C. to 400° C. e.g., 250° C. to 350° C.) can be performed in an inert gas atmosphere or in an oxygen gas atmosphere. For example, the second heat treatment is performed at 250° C. in a nitrogen atmosphere for one hour.

In the above-described process, the first heat treatment is performed on the oxide semiconductor film, allowing an impurity such as hydrogen, moisture, hydroxyl group, or hydride (also referred to as a hydrogen compound) to be intentionally removed from the oxide semiconductor layer, and oxygen to be supplied to the oxide semiconductor layer. Thus, the oxide semiconductor layer is highly purified. This is an example of the fabrication process of the transistor shown in FIG. 10D.

Note that although an example the fabrication method of the transistors shown in FIGS. 10A and 10D and FIG. 11A has been shown as an example of the fabrication method of the transistor in this embodiment, an example the fabrication method of the transistor of this embodiment is not limited to this. For example, an example of the description of the fabrication method of the transistors shown in FIGS. 10A and 10D and FIG. 11A can be applied as appropriate to the components shown in FIGS. 10B and 10C and FIGS. 11B to 11D if each of these components has the same designation and at least one same function as any of the components shown in FIGS. 10A and 10D and FIG. 11A.

As described above, the transistor of this embodiment is a transistor having an oxide semiconductor layer serving as a channel formation layer. The oxide semiconductor layer used in the transistor is highly purified by heat treatment and thus is an i-type or substantially i-type oxide semiconductor layer.

In addition, the highly purified oxide semiconductor layer includes extremely few carriers (close to zero), and the carrier concentration is lower than $1\times10^{14}/cm^3$, preferably lower than $1\times10^{12}/cm^3$, more preferably lower than $1\times10^{11}/cm^3$. Since the highly purified oxide semiconductor layer includes extremely few carriers, the off-state current of the transistor of this embodiment can be reduced. The lower the off state current, the better. In the transistor of this embodiment, the off-state current per micrometer of channel width can be 10 aA ($1\times10^{-17}$ A) or less, 1 aA ($1\times10^{-18}$ A) or less, 10 zA ($1\times10^{-20}$ A) or less, or 1 zA ($1\times10^{-21}$ A) or less.

The transistor of this embodiment has a relatively high field-effect mobility, and thus is capable of high-speed driving.

When any one of the transistors of this embodiment each of which has a plurality of gates is used, for example, as the transistor in the comparator circuit of the A/D converter circuit included in the semiconductor circuit of Embodiment 1 or the display device of Embodiment 3 (e.g., the transistor 1122 shown in FIG. 3), it is possible to easily fabricate a transistor the threshold voltage of which can be controlled and control variations in the voltage of an output signal of the comparator circuit due to leakage current of the transistor being off.

When any one of the transistors of this embodiment is used, for example, as the transistor in the photoelectric conversion circuit included in the semiconductor circuit of Embodiment 2 or the display device of Embodiment 3 (e.g., the transistor 111b shown in FIG. 5), it is possible to control variations in the voltage of a connection point between the transistor and another element (e.g., the node N21 shown in FIG. 5) due to leakage current of the transistor being off.

When any one of the transistors of this embodiment is used in the semiconductor circuit of Embodiment 1 or the display device of Embodiment 3, it is possible to form the photoelectric conversion circuit and the A/D converter circuit (at least the comparator circuit) included in the semiconductor circuit of Embodiment 1 or the display device of Embodiment 3 over the same substrate and in the same process. This makes it possible to reduce noise in a signal inputted from the photoelectric conversion circuit to the A/D converter circuit.

Note that this embodiment can be combined with or replaced by any of the other embodiments as appropriate.

(Embodiment 5)

In this embodiment, an example of a plurality of transistors applicable to the semiconductor circuit of Embodiment 1 will be described.

Figure 15:
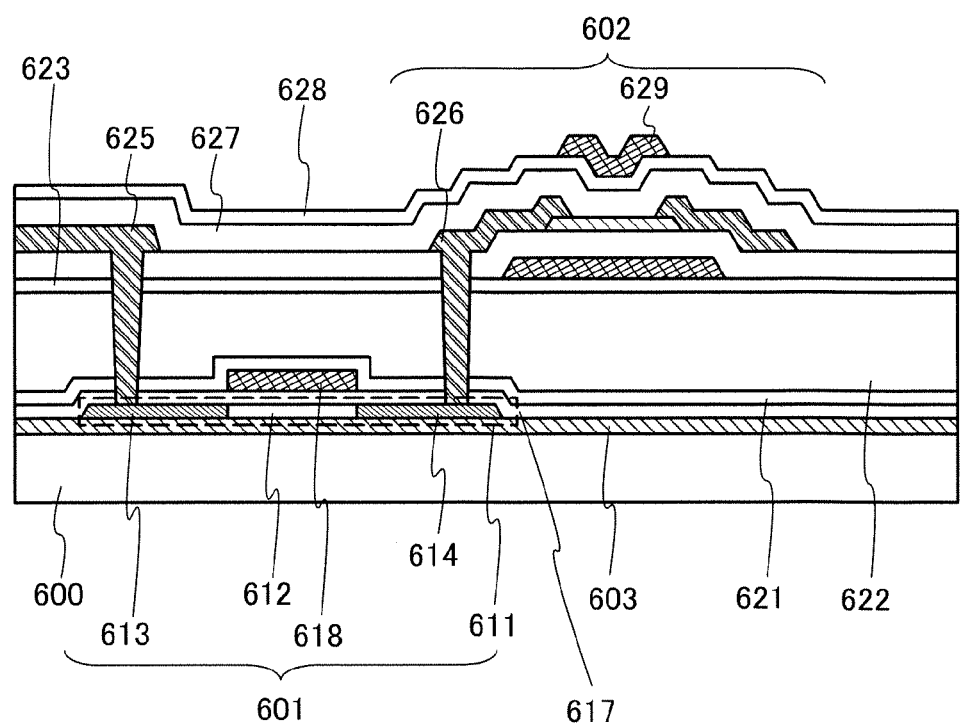
FIG. 15 is a cross-sectional schematic view showing an example of the structure of a plurality of transistors of Embodiment 5.

An example of the structure of a plurality of transistors of this embodiment which are applicable to the semiconductor circuit of Embodiment 1 will be described with reference to FIG. 15. FIG. 15 is a cross-sectional schematic view showing an example of the structure of the plurality of transistors of this embodiment. Note that although FIG. 15 shows an example of a structure in which a transistor having a single gate and a transistor having two gates are combined, the structure is not limited to this; all the transistors can be those having a plurality of gates.

The structure shown in FIG. 15 which includes a plurality of transistors is a structure including a transistor 601 having a single gate and a transistor 602 having two gates.

The transistor 601 is formed over a substrate 600 with an insulating layer 603 interposed therebetween.

Further, the transistor 601 includes a semiconductor layer 611 serving as a channel formation layer, an insulating layer 617 serving as a gate insulating layer, and a conductive layer 618 serving as a gate electrode.

The semiconductor layer 611 is formed over the substrate 600 with the insulating layer 603 interposed therebetween. The insulating layer 617 is formed over the semiconductor layer 611. The conductive layer 618 is formed over the semiconductor layer 611 with the insulating layer 617 interposed therebetween.

In addition, the semiconductor layer 611 includes a channel formation region 612 below the conductive layer 618, an impurity region 613 serving as one of a source region and a drain region, and an impurity region 614 serving as the other of the source region and the drain region. Note that a first high-resistance impurity region may be formed between the channel formation region 612 and the impurity region 613, and a second high-resistance impurity region may be formed between the channel formation region 612 and the impurity region 614. The first high-resistance impurity region and the second high-resistance impurity region are regions the resistance of which is higher than that of the impurity region 613 and the impurity region 614 and are formed, for example, by adding an impurity element, which gives n-type or p-type conductivity, to part of the semiconductor layer 611 so that the first high-resistance impurity region and the second high-resistance impurity region may each have a lower impurity concentration than the impurity region 613 and the impurity region 614. By providing the first high-resistance region and the second high-resistance region, a concentration of an electric field applied between the source and the drain of the transistor can be reduced.

The transistor 602 is formed in an upper layer of the transistor 601 with an insulating layer 621, an insulating layer 622 serving as a planarization layer, and an insulating layer 623 interposed therebetween. The transistor 602 can be, for example, any one of the transistors of Embodiment 4 which have a plurality of gates. In FIG. 15, the transistor that has been described with reference to FIG. 11A is shown as an example of the transistor 602.

A conductive layer 626 serving as one of a source electrode and a drain electrode of the transistor 602 is in contact with the impurity region 614 through an opening formed in the insulating layer 617, the insulating layer 621, the insulating layer 622, and the insulating layer 623. Alternatively, the conductive layer 626 may be in contact with the impurity region 614 through a plurality of conductive layers.

A conductive layer 625 in the same layer as the conductive layer 626 serving as one of the source electrode and the drain electrode of the transistor 602 is in contact with the impurity region 613 through an opening formed in the insulating layer 617, the insulating layer 621, the insulating layer 622, and the insulating layer 623. Alternatively, the conductive layer 625 may be in contact with the impurity region 613 through a plurality of conductive layers.

In the transistor 602, an oxide insulating layer 627 is in contact with part of the upper surface (the upper surface over which conductive layers serving as a source electrode and a drain electrode are not formed) of an oxide semiconductor layer serving as a channel formation layer. Further, a protective insulating layer 628 is formed over the oxide insulating layer 627. Furthermore, a conductive layer 629 overlapping with the oxide semiconductor layer serving as the channel formation layer of the transistor 602 is formed over the protective insulating layer 628.

The substrate 600 can be, for example, a glass substrate, a ceramic substrate, a quartz substrate, a plastic substrate, or a silicon substrate.

The insulating layer 603 can be, for example, a silicon nitride layer, a silicon oxide layer, a silicon nitride oxide layer, a silicon oxynitride layer, an aluminum oxide layer, or an aluminum oxynitride layer. Alternatively, the insulating layer 603 can be, for example, a stack of a layer of any of the above-described materials applicable to the insulating layer 603; a silicon oxide layer containing, for example, hydrogen; a silicon nitride layer containing hydrogen; a silicon nitride layer containing oxygen and hydrogen; a silicon oxynitride layer; or a silicon nitride oxide layer. Silicon oxide containing, for example, hydrogen is preferably silicon oxide formed using organosilane. A silicon oxide film formed using organosilane can increase bonding strength between the substrate 600 and the semiconductor layer 611. Organosilane can be, for example, a silicon-containing compound such as tetraethoxysilane (TEOS, $Si(OC_2H_5)_4$), tetramethylsilane (TMS, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or tris(dimethylamino)silane ($SiH(N(CH_3)_2)_3$).

The semiconductor layer 611 can be, for example, a layer containing one or both of silicon and germanium. Alternatively, the semiconductor layer 611 can be a single crystal semiconductor layer, a polycrystalline semiconductor layer, a microcrystalline semiconductor layer, or an amorphous semiconductor layer.

When a single crystal semiconductor layer is used as the semiconductor layer 611, a single crystal semiconductor substrate is firstly prepared; then, a damaged region is formed in the single crystal semiconductor substrate. The damaged region is formed, for example, by ion irradiation. Further, the single crystal semiconductor substrate with the damaged region and the substrate 600 are bonded to each other with the insulating layer 603 interposed therebetween, and then part of the single crystal semiconductor substrate is separated from a bonded substrate (the single crystal semiconductor substrate and the substrate 600) along the damaged region. In a next step, a remaining single crystal semiconductor region over the substrate 600 is selectively removed by etching or the like. Thus, the single crystal semiconductor layer can be formed.

Each of the impurity region 613 and the impurity region 614 is a region containing an impurity element giving n-type or p-type conductivity, and is formed, for example, by addition of an impurity element giving n-type or p-type conductivity.

The insulating layer 617 can be, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer. Alternatively, the insulating layer 617 can be a stack of any of the materials applicable to the insulating layer 617. The layers of any of the materials applicable to the insulating layer 617 can be formed by plasma enhanced CVD or sputtering, for example. For example, the insulating layer 617 can be formed in the following manner: a silicon nitride layer is formed by plasma enhanced CVD, and a silicon oxide layer is formed over the silicon nitride layer by plasma enhanced CVD.

The conductive layer 618 can be, for example, a layer of a metal material such as molybdenum, titanium, chromium, tantalum, tungsten, aluminum, copper, neodymium, or scandium; or an alloy material containing any of these materials as a main component. Alternatively, the conductive layer 618 can be a stack of layers of any of the materials applicable to the conductive layer 618.

The insulating layer 621 can be, for example, a silicon nitride layer, a silicon oxide layer, a silicon nitride oxide layer, a silicon oxynitride layer, an aluminum oxide layer, or an aluminum oxynitride layer. Alternatively, the insulating layer 621 can be a stack of layers of any of the materials applicable to the insulating layer 621. The insulating layer 621 is formed, for example, by plasma enhanced CVD.

The insulating layer 622 can be, for example, an organic material layer or an inorganic material layer. Alternatively, the insulating layer 622 can be a stack of layers of any of the materials applicable to the insulating layer 622. The insulating layer 622 is formed, for example, by plasma enhanced CVD.

The insulating layer 623 can be, for example, a silicon nitride layer, a silicon oxide layer, a silicon nitride oxide layer, a silicon oxynitride layer, an aluminum oxide layer, or an aluminum oxynitride layer. Alternatively, the insulating layer 623 can be a stack of layers of any of the materials applicable to the insulating layer 623. The insulating layer 623 is formed, for example, by plasma enhanced CVD.

Each of the conductive layer 625 and the conductive layer 626 can be, for example, a layer of any of the materials applicable to a conductive layer serving as the source electrode or the drain electrode of the transistor 602. Alternatively, each of the conductive layer 625 and the conductive layer 626 can be a stack of layers of any of the materials applicable to the conductive layer 625 and the conductive layer 626.

As shown in FIG. 15 as an example, a plurality of transistors having different structures can constitute the semiconductor circuit of Embodiment 1. Thus, it is possible to select and use a suitable transistor according to the properties of the circuit; for example, when a transistor having a low off-state current is needed, such a transistor can be a transistor having an oxide semiconductor layer (e.g., the transistor 602), while the other transistors can be transistors having oxide semiconductor layers or transistors using another material (e.g., the transistor 601).

Note that this embodiment can be combined with or replaced by any of the other embodiments as appropriate.
(Embodiment 6)

In this embodiment, an example of the structure of the display device of Embodiment 3 whose pixel portion employs a photodetection unit will be described.

Figure 16:
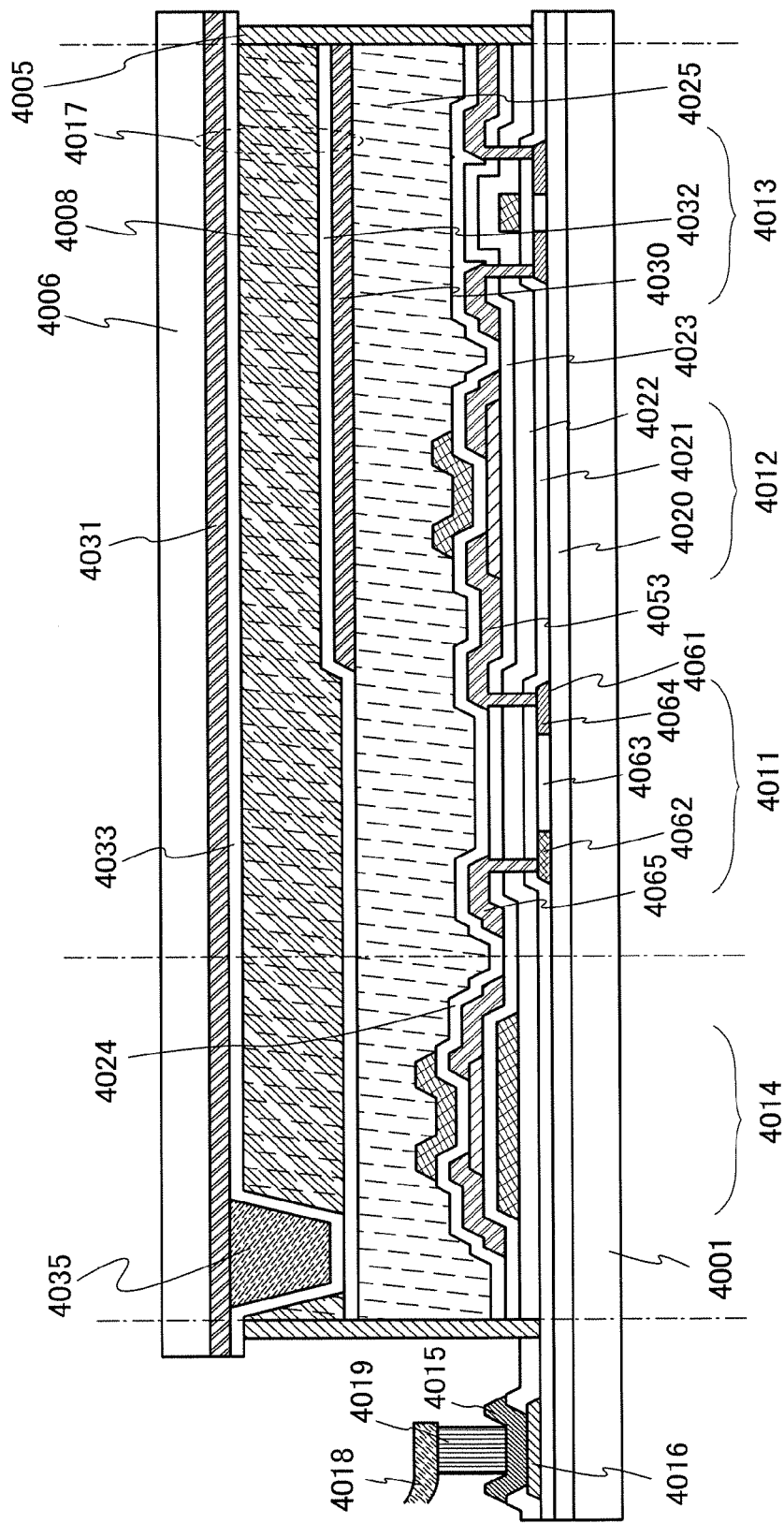
FIG. 16 is a cross-sectional view showing an example of the structure of a display device of Embodiment 6.

An example of the structure of a display device of this embodiment will be described with reference to FIG. 16. FIG. 16 is a cross-sectional schematic view showing an example of the structure of the display device of this embodiment.

The display device shown in FIG. 16 is a display device including a lateral photodiode in its pixel portion. Note that the display device of this embodiment is not limited to this and can be a display device including a photodiode that is a stack of a p-type semiconductor layer overlaid by an i-type semiconductor layer overlaid by an n-type semiconductor layer.

A display device shown in FIG. 16 includes a pixel portion and a driver circuit area in a region sealed by a sealant 4005 being between a substrate 4001 and a substrate 4006. The pixel portion includes a photodiode 4011, a transistor 4012, and a transistor 4013. The driver circuit area includes a transistor 4014.

The pixel portion includes display circuits and photosensors. The structure of the pixel portion can be, for example, the structure of the display device of Embodiment 3. FIG. 16 shows a part of the photosensor, for example.

The driver circuit area includes at least a part of the circuits for controlling the display circuits included in the pixel portion and at least a part of the circuits for controlling the photosensors included in the pixel portion. The structure of the driver circuit area can be, for example, the structure of the display circuit controller circuit and the photosensor controller circuit of Embodiment 3. FIG. 16 shows a part of the photosensor reading circuit, for example.

Alternatively, a driver circuit separately formed over the substrate can constitute a part of the driver circuit used in the driver circuit area. Here, there is no particular limitation on a method for connecting the display device shown in FIG. 16 to the driver circuit separately formed: the method can be COG, wire bonding, TAB, or the like.

The photodiode 4011 includes a semiconductor layer 4061. The semiconductor layer 4061 includes a p-type impurity region 4062, a high-resistance semiconductor region 4063, and an n-type impurity region 4064. The photodiode 4011 is formed, for example, in the same process as the transistor 4013. The semiconductor layer 4061 can be a layer of a material applicable to a semiconductor layer of the transistor 4013.

The transistor 4012 can be, for example, any one of the transistors of Embodiment 4. In FIG. 16, the transistor that has been described with reference to FIG. 10D is shown as an example of the transistor 4012. The transistor 4012 is not limited to this and can be a transistor with the structure that has been described with reference to FIG. 10A, thereby suppressing light entering an oxide semiconductor layer of the transistor.

A conductive layer 4053 serving as one of a source electrode and a drain electrode of the transistor 4012 is in contact with the n-type impurity region 4064 of the photodiode 4011 through an opening formed in the insulating layer 4021, the insulating layer 4022, and the insulating layer 4023. Alternatively, the display device of this embodiment may have the conductive layer 4053 being in contact with the n-type impurity region 4064 through a plurality of conductive layers.

A conductive layer 4065 is in contact with the p-type impurity region 4062 of the photodiode 4011 through an opening formed in the insulating layer 4021, the insulating layer 4022, and the insulating layer 4023. Alternatively, the display device of this embodiment may have the conductive layer 4065 being in contact with the p-type impurity region 4062 through a plurality of conductive layers.

The transistor 4013 can be, for example, a transistor having the structure that has been described using the transistor 601 shown in FIG. 15. In FIG. 16, a transistor having the structure that has been described using the transistor 601 is shown as an example of the transistor 4013.

The transistor 4014 can be, for example, any of the transistors of Embodiment 4 which have a plurality of gates. By using a transistor having a plurality of gates, the transistor 220 included in the comparator 219 of Embodiment 3 can be formed, for example. FIG. 16 shows a transistor having the structure that has been described using the transistor 4014 as an example with reference to FIG. 11D.

The display device shown in FIG. 16 further includes a planarization layer 4025, a conductive layer 4030 serving as a pixel electrode, an insulating layer 4032, a liquid crystal layer 4008, an insulating layer 4033, an insulating layer 4035 serving as a spacer, and a conductive layer 4031 serving as a counter electrode.

The planarization layer 4025 is formed over the photodiode 4011, the transistor 4012, the transistor 4013, and the transistor 4014. The conductive layer 4030 is formed over the planarization layer 4025. The insulating layer 4032 is formed over the planarization layer 4025 with the conductive layer 4030 interposed therebetween. The conductive layer 4031 is in contact with the substrate 4006. The insulating layer 4033 is in contact with the conductive layer 4031. The insulating layer 4035 is formed in a region enclosed by the sealant 4005 and formed between the conductive layer 4030 or the planarization layer 4025 and the conductive layer 4031 through the insulating layer 4032 and the insulating layer 4033. The liquid crystal layer 4008 is formed in a region enclosed by the sealant 4005 and formed between the conductive layer 4030 or the planarization layer 4025 and the conductive layer 4031 through the insulating layer 4032 and the insulating layer 4033.

A liquid crystal element 4017 is formed using the conductive layer 4030, the conductive layer 4031, and the liquid crystal layer 4008.

The conductive layer 4031 is electrically connected to a common voltage line formed over the same substrate as the transistor 4012 and the like. The conductive layer 4031 can be electrically connected to the common voltage line with the use of a connection point to the common voltage line (also referred to as a common connection point) and via conductive particles placed between the pair of substrates.

The insulating layer 4035 is a columnar spacer obtained by selective etching of an insulating film and is formed in order to control the distance (a cell gap) between the conductive layer 4030 and the conductive layer 4031. A spherical spacer may be used as the insulating layer 4035.

The display device shown in FIG. 16 is electrically connected to a conductive layer 4016 formed over the substrate 4001 with an insulating layer 4020 and the insulating layer 4021 interposed therebetween; a conductive layer 4015 being in contact with the conductive layer 4016; and an FPC 4018 through an anisotropic conductive layer 4019. The conductive layer 4015 and the conductive layer 4016 serve as terminal electrodes.

The conductive layer 4015 is formed using the same conductive film as the conductive layer 4030, for example. The conductive layer 4016 is formed using the same conductive film as a conductive layer serving as a source electrode or a drain electrode of the transistor 4014, for example.

Each of the substrate 4001 and the substrate 4006 can be, for example, a light-transmitting substrate. The light-transmitting substrate can be, for example, a glass substrate, a plastic substrate, or the like. The plastic substrate can be, for example, a fiberglass-reinforced plastics (FRP) plate, a polyvinyl fluoride (PVF) film, a polyester film, or an acrylic resin film.

The planarization layer 4025 can be, for example, a layer of a heat-resistant organic material such as polyimide, an acrylic resin, a benzocyclobutene-based resin, polyamide, or an epoxy resin. The planarization layer 4025 can be, instead of a layer of the above-stated material, a layer of a low-dielectric constant material (a low-k material), a siloxane-based resin, PSG (phosphosilicate glass), BPSG (borophosphosilicate glass), or the like. Alternatively, the planarization layer 4025 can be a stack of layers of any of the materials applicable to the planarization layer 4025.

There is no particular limitation on the method for forming the planarization layer 4025: the planarization layer 4025 can be formed, in accordance with the material, by sputtering, SOG, spin coating, dip coating, spray coating, a droplet discharge method (e.g., an ink-jet method, screen printing, or offset printing), a formation method using a doctor knife, a formation method using a roll coater, a formation method using a curtain coater, or a formation method using a knife coater.

Each of the conductive layer 4030 and the conductive layer 4031 can be, for example, a layer of a light-transmitting conductive material. Examples of such a light-transmitting conductive material are an indium tin oxide, a metal oxide in which zinc oxide is mixed in indium oxide (referred to as indium zinc oxide (IZO)), a conductive material in which silicon oxide ($SiO_2$) is mixed in indium oxide, organoindium, organotin, indium oxide containing tungsten oxide, indium zinc oxide containing tungsten oxide, indium oxide containing titanium oxide, and indium tin oxide containing titanium oxide. In the case where the display device of this embodiment is a reflective liquid crystal display, one of the conductive layer 4030 and the conductive layer 4031 can be, for example, a layer of a metal such as tungsten, molybdenum, zirconium, hafnium, vanadium, niobium, tantalum, chromium, cobalt, nickel, titanium, platinum, aluminum, copper, or silver; or an alloy of any of these metals. Alternatively, each of the conductive layer 4030 and the conductive layer 4031 can be a stack of layers of any of the materials applicable to the conductive layer 4030 and the conductive layer 4031.

Alternatively, the conductive layer 4030 and the conductive layer 4031 can be formed using a conductive composition containing a conductive high molecule (also referred to as a conductive polymer). A conductive layer formed using the conductive composition preferably has a sheet resistance of 10000 ohms or less per square and a transmittance of 70% or more at a wavelength of 550 nm. The resistivity of the conductive high molecule contained in the conductive composition is preferably 0.1 Ω·cm or less.

The conductive high molecule can be a so-called π-electron conjugated conductive high molecule. Examples of the π-electron conjugated conductive high molecule are polyaniline; a derivative of polyaniline; polypyrrole; a derivative of polypyrrole; polythiophene; a derivative of polythiophene; a copolymer of two or more of aniline, pyrrole, and thiophene; and a derivative of such a copolymer.

The sealant 4005 can be an insulating layer containing conductive particles.

The liquid crystal element 4017 can be, for example, TN liquid crystal, OCB liquid crystal, STN liquid crystal, VA liquid crystal, ECB liquid crystal, GH liquid crystal, polymer dispersed liquid crystal, or discotic liquid crystal.

Examples of a display mode for the liquid crystal element 4017 are a TN (twisted nematic) mode, an IPS (in-plane-switching) mode, a VA (vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, an MVA (multi-domain vertical alignment) mode, a PVA (patterned vertical alignment) mode, and an ASV. The display mode is not limited to those described above, and may be an FFS (fringe field switching) mode or the like.

Alternatively, the liquid crystal layer 4008 can be, for example, a liquid crystal layer exhibiting a blue phase for which an alignment film is unnecessary. The blue phase is one of the liquid crystal phases, which appears just before a cholesteric phase changes into an isotropic phase while the temperature of the cholesteric liquid crystal is increased. Since the blue phase appears only within a narrow range of temperatures, a liquid crystal composition containing a chiral agent at 5 wt % or more is used as a liquid crystal material in order to widen the temperature range. The liquid crystal composition which contains a liquid crystal exhibiting a blue phase and a chiral agent has a short response time of 1 msec or less and has optical isotropy, which makes the alignment process unnecessary, and the viewing-angle dependence is small. In addition, since an alignment film does not need to be provided and rubbing treatment is also unnecessary, electrostatic discharge damage caused by the rubbing treatment can be prevented and defects and damage of the display device in the fabrication process can be reduced. Thus, productivity of the display device can be increased. A transistor including an oxide semiconductor layer particularly has a possibility that electric characteristics of the transistor may fluctuate significantly due to static electricity and deviate from the design range. Therefore, by using a liquid crystal material showing a blue phase for the display device including a transistor including an oxide semiconductor layer, the fluctuation of electric characteristics due to static electricity can be reduced.

In the display device of this embodiment, a polarizing plate may be provided on the outer side of the substrate (on the viewer side) and a coloring layer and an electrode layer used in a display element may be sequentially provided on the inner side of the substrate; alternatively, the polarizing plate may be provided on the inner side of the substrate. The structure of a stack of the polarizing plate and the coloring layer may be set as appropriate in accordance with materials for the polarizing plate and the coloring layer and the conditions of the fabrication process. Further, a light-blocking layer serving as a black matrix may be provided in an area other than the display area.

A black matrix (a light-blocking layer); an optical member (an optical substrate) such as a polarizing member, a retardation member, or an anti-reflection member; or the like can be provided as appropriate to the display devices of this embodiment. The optical member may be, for example, a circular polarizer using a polarizing substrate and a retardation substrate. A light source used can be a backlight or the like.

In order to improve moving-image characteristics of the display device, a driving technique may be employed in which a plurality of LED (light-emitting diode) light sources or a plurality of EL light sources is used to form a surface light source to be a backlight, and each light source of the surface light source is independently driven in a pulsed manner in one frame period. The surface light source may be formed using three or more kinds of LEDs or using an LED that emits white light. Since a plurality of LEDs can be controlled independently, the light emission timing of the LEDs can be synchronized with the timing at which a liquid crystal layer is optically modulated. In this driving technique, LEDs can be partly turned off, so that especially in the case of displaying an image in which the proportion of a black image area in one screen is high, power consumption can be reduced.

Since the transistor is easily broken due to static electricity or the like, it is preferable that a protective circuit be formed over the same substrate as the pixel portion and the driver circuit area. The protective circuit is preferably formed using a non-linear element including an oxide semiconductor layer. For example, protective circuits are provided between the pixel portion and a scan line input terminal and between the pixel portion and a signal line input terminal. In this embodiment, a plurality of protective circuits is provided so that the transistor in the pixel and the like may not be broken when a surge voltage due to static electricity or the like is applied to a scan line, a signal line, or a capacitor bus line. Therefore, the protective circuit is formed so that charge may be released to a common wiring when a surge voltage is applied to the protective circuit. Further, the protective circuit includes a non-linear element placed in parallel to the scan line. The non-linear element includes a two-terminal element such as a diode or a three-terminal element such as a transistor. For example, the non-linear element can be formed through the same process as the transistor in the pixel portion. For example, characteristics similar to those of a diode can be obtained by connecting a gate terminal to a drain terminal of the non-linear element.

Thus, the display device of this embodiment employing a photodetection unit can be fabricated. By employing the structure of the display device of this embodiment, the pixel portion and the photosensor reading circuit can be formed over the same substrate, thus suppressing the influence of noise to the photosensor reading circuit.

Note that this embodiment can be combined with or replaced by any of the other embodiments as appropriate.

(Embodiment 7)

In this embodiment, electronic appliances each having the display device of Embodiments 3 and 6 whose pixel portion employs a photodetection unit will be described.

An example of the structure of each electronic appliance of this embodiment will be described with reference to FIGS. 17A to 17F. FIGS. 17A to 17F are diagrams each showing an example of the structure of the electronic appliance of this embodiment.

Figure 17A:
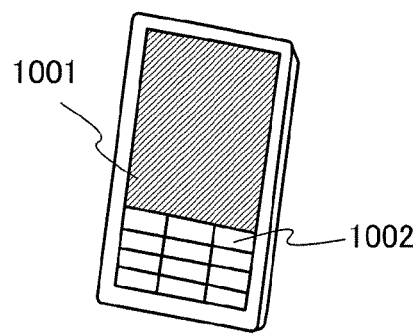
FIGS. 17A to 17F are diagrams each showing an example of the structure of an electronic appliance of Embodiment 7.

The electronic appliance shown in FIG. 17A is a personal digital assistant. The personal digital assistant shown in FIG. 17A includes at least a display area 1001. The display device of Embodiments 3 and 6 is used in the display area 1001. When the display device of Embodiments 3 and 6 is used in the display area 1001, providing an operating unit 1002 that uses a touch panel to the display area 1001 enables the personal digital assistant to be used as a cellular phone. The operating unit 1002 is not necessarily provided to the display area 1001: the electronic appliance shown in FIG. 17A can have operation buttons instead. Moreover, the personal digital assistant shown in FIG. 17A can be used as a notepad or a handy scanner.

Figure 17D:
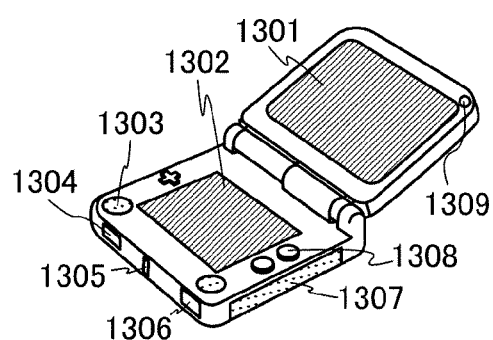
Figure 17B:
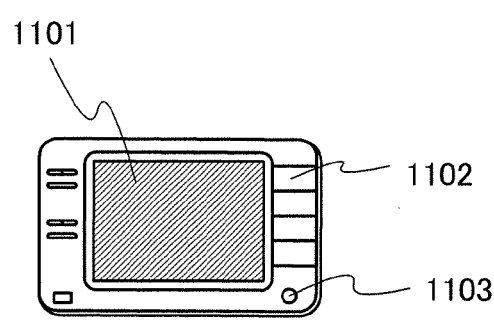

The electronic appliance shown in FIG. 17B is an information terminal with an automotive navigation system, for example. The information terminal shown in FIG. 17B includes at least a display area 1101. The information terminal shown in FIG. 17B can also include operation buttons 1102 and an external input terminal 1103. The in-car temperature changes greatly in accordance with the outside-air temperature, and sometimes exceeds 50° C. However, the display device of Embodiments 3 and 6 are less affected by characteristic variation due to temperatures, and thus is effective particularly under circumstances where the temperature greatly changes e.g., inside a car. The display device of Embodiments 3 and 6 is used in the display area 1101. When the display device of Embodiments 3 and 6 is used in the display area 1101, it is possible to operate the information terminal by touching or not touching the display area 1101, improving the ease of use of the information terminal.

Figure 17E:
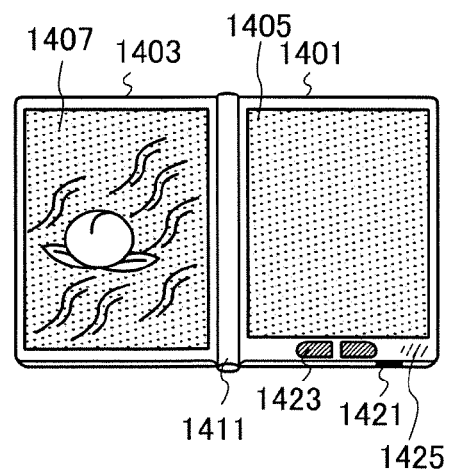
Figure 17C:
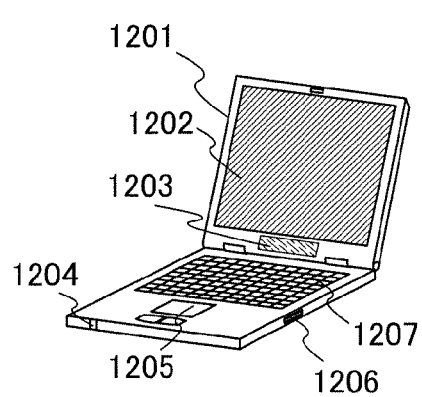

The electronic appliance shown in FIG. 17C is a laptop personal computer. The laptop personal computer shown in FIG. 17C includes a housing 1201, a display area 1202, a speaker 1203, an LED lamp 1204, a pointing device 1205, a connection terminal 1206, and a keyboard 1207. The display device of Embodiments 3 and 6 is used in the display area 1202. When the display device of Embodiments 3 and 6 is used in the display area 1202, it is possible to perform an input operation in such a way as to directly write letters on the display area 1202 and provide an input area serving as a substitute for the keyboard 1207 to the display area 1202.

The electronic appliance shown in FIG. 17D is a portable game console. The portable game console shown in FIG. 17D includes a display area 1301, a display area 1302, a speaker 1303, a connection terminal 1304, an LED lamp 1305, a microphone 1306, a recording medium reading portion 1307, operation buttons 1308, and a sensor 1309. The display device of Embodiments 3 and 6 is used in both the display area 1301 and the display area 1302, or either the display area 1301 or the display area 1302. When the display device of Embodiments 3 and 6 is used in the display area 1301 or the display area 1302, it is possible to operate the display area 1301 or the display area 1302 by touching or not touching the portable game console, improving the ease-of use of an input member such as a finger or pen.

The electronic appliance shown in FIG. 17E is an electronic book. The electronic book shown in FIG. 17E includes at least a housing 1401, a housing 1403, a display area 1405, a display area 1407, and a hinge 1411.

The housing 1401 and the housing 1403 are connected by the hinge 1411. The electronic book shown in FIG. 17E can be opened or closed using the hinge 1411 as an axis. Such a structure allows the e-book reader to be handled like a paper book. The display area 1405 is incorporated into the housing 1401, and the display area 1407 is incorporated into the housing 1403. The display area 1405 and the display area 1407 may display different images i.e., one image may be displayed across the display area 1405 and the display area 1407, for example. When the display area 1405 and the display area 1407 display different images, text can be displayed on a display area on the right side (the display area 1405 in the case of FIG. 17E) and graphics can be displayed on a display area on the left side (the display area 1407 in the case of FIG. 17E).

The electronic book shown in FIG. 17E may also include an operating unit in the housing 1401. For example, the electronic book shown in FIG. 17E can include a power button 1421, control keys 1423, and a speaker 1425. When using the electronic book shown in FIG. 17E, it is possible to turn the pages of an image across a plurality of pages by using the control keys 1423. In the electronic book shown in FIG. 17E, both the display area 1405 and the display area 1407, or either the display area 1405 or the display area 1407 may include a keyboard, a pointing device, or the like. An external connection terminal (an earphone terminal, a USB terminal, a terminal connectable to a variety of cables such as an AC adapter or a USB cable, or the like), a recording medium insertion portion, or the like may be provided on the rear surface or the side surface of the housing 1401 and the housing 1403 of the electronic book shown in FIG. 17E. The electronic book shown in FIG. 17E may be provided with a dictionary function.

The display device of Embodiments 3 and 6 can be used in both the display area 1405 and the display area 1407, or either the display area 1405 or the display area 1407. When the display device of Embodiments 3 and 6 is used in the display area 1405 or the display area 1407, it is possible to operate the electronic book by touching or not touching the display area 1405 or the display area 1407, improving the ease-of use of an input member such as a finger or pen.

The electronic book shown in FIG. 17E may be capable of transmitting and receiving data by wireless communication. Having such a system, the electronic book can also be provided with a function that makes it possible to purchase and download desired book data or the like from an electronic book server.

Figure 17F:
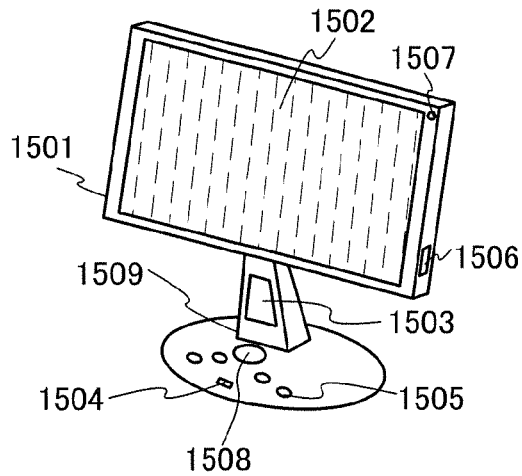

The electronic appliance shown in FIG. 17F is a display. The display shown in FIG. 17F includes a housing 1501, a display area 1502, a speaker 1503, an LED lamp 1504, operation buttons 1505, a connection terminal 1506, a sensor 1507, a microphone 1508, and a support 1509. The display device of Embodiments 3 and 6 is used in the display area 1502. When the display device of Embodiments 3 and 6 is used in the display area 1502, it is possible to operate the display by touching or not touching the display area 1502, improving the ease-of use of an input member such as a finger or pen.

The electronic book of this embodiment may have a power supply circuit including a solar battery cell, a power storage device for charging voltage that is output from the solar battery cell, and a DC converter for converting a voltage held in the power storage device into a voltage needed for each circuit. Consequently, an external power supply is not needed, and the electronic book can be used for a long period of time even at a place with no external power supply, improving the convenience of the electronic book. The power storage device can be one or more of the following objects: a lithium ion secondary battery, a lithium ion capacitor, an electric double-layer capacitor, a redox capacitor, and the like. For example, the combination of a lithium ion secondary battery and a lithium ion capacitor can be a power storage device capable of high-speed charging and discharging and of supplying power for a long time. The power storage device is not limited to the lithium ion secondary battery; the power storage device may be a secondary battery instead, in which another alkali metal ion, alkaline earth metal ion, or the like is used as a mobile ion. The power storage device is also not limited to the lithium ion capacitor; the power storage device may be a capacitor instead, in which another alkali metal ion, alkaline earth metal ion, or the like is used as a mobile ion.

As described above, it is possible to provide an electronic appliance that can be operated by touching or not touching a display area by using the display device of Embodiments 3 and 6 in each of the above-described electronic appliances.

Note that this embodiment can be combined with or replaced by any of the other embodiments as appropriate.

This application is based on Japanese Patent Application serial No. 2010-029010 filed with Japan Patent Office on Feb. 12, 2010, the entire contents of which are hereby incorporated by reference.

EXPLANATION OF REFERENCE

100: display device, 101: pixel circuit, 102: display circuit controller circuit, 103: photosensor controller circuit, 104: pixel, 105: display circuit, 106: photosensor, 107: display circuit driver circuit, 108: display circuit driver circuit, 109: photosensor reading circuit, 110: photosensor driver circuit, 111: photoelectric conversion circuit, 111a: photoelectric conversion element, 111b: transistor, 111c: transistor, 111d: transistor, 112: A/D converter circuit, 112a: comparator circuit, 112b: A/D conversion controller circuit, 112c: D/A converter, 121: period, 122: period, 123: period, 201: transistor, 202: storage capacitor, 203: liquid crystal element, 204: photodiode, 205: transistor, 206: transistor, 207: transistor, 208: gate line, 209: gate line, 210: photodiode reset line, 211: gate line, 212: video data line, 213: photosensor reference line, 214: photosensor output line, 215: gate line, 216: precharge circuit, 217: transistor, 218: precharge line, 219: comparator, 220: transistor, 221: resistor, 222: comparator output line, 223: back gate line, 224: A/D converter circuit, 301: signal, 302: signal, 303: signal, 304: signal, 305: signal, 306: signal, 307: signal, 308: signal, 400a: substrate, 400b: substrate, 400c: substrate, 400d: substrate, 401a: conductive layer, 401b: conductive layer, 401c: conductive layer, 401d: conductive layer, 402a: insulating layer, 402b: insulating layer, 402c: insulating layer, 402d: insulating layer, 403a: oxide semiconductor layer, 403b: oxide semiconductor layer, 403c: oxide semiconductor layer, 403d: oxide semiconductor layer, 405a: conductive layer, 405b: conductive layer, 405c: conductive layer, 405d: conductive layer, 406a: conductive layer, 406b: conductive layer, 406c: conductive layer, 406d: conductive layer, 407a: oxide insulating layer, 407c: oxide insulating layer, 409a: protective insulating layer, 409b: protective insulating layer, 409c: protective insulating layer, 431a: conductive layer, 431b: conductive layer, 431c: conductive layer, 431d: conductive layer, 427: insulating layer, 447: insulating layer, 530: oxide semiconductor film, 600: substrate, 601: transistor, 602: transistor, 603: insulating layer, 611: semiconductor layer, 612: channel formation region, 613: impurity region, 614: impurity region, 617: insulating layer, 618: conductive layer, 621: insulating layer, 622: insulating layer, 623: insulating layer, 625: conductive layer, 626: conductive layer, 627: oxide insulating layer, 628: protective insulating layer, 629: conductive layer, 1001: display area, 1002: operating unit, 1101: display area, 1102: operation button, 1103: external input terminal, 1121: resistor, 1122: transistor, 1201: housing, 1202: display area, 1203: speaker, 1204: LED lamp, 1205: pointing device, 1206: connection terminal, 1207: keyboard, 1301: display area, 1302: display area, 1303: speaker, 1304: connection terminal, 1305: LED lamp, 1306: microphone, 1307: recording medium reading portion, 1308: operation button, 1309: sensor, 1401: housing, 1403: housing, 1405: display area, 1407: display area, 1411: hinge, 1421: power button, 1423: control key, 1425: speaker, 1501: housing, 1502: display area, 1503: speaker, 1504: LED lamp, 1505: operation button, 1506: connection terminal, 1507: sensor, 1508: microphone, 1509: support, 4001: substrate, 4005: sealant, 4006: substrate, 4008: liquid crystal layer, 4011: photodiode, 4012: transistor, 4013: transistor, 4014: transistor, 4015: conductive layer, 4016: conductive layer, 4017: liquid crystal element, 4018: FPC, 4019: anisotropic conductive layer, 4020: insulating layer, 4021: insulating layer, 4022: insulating layer, 4023: insulating layer, 4025: planarization layer, 4030: conductive layer, 4031: conductive layer, 4032: insulating layer, 4033: insulating layer, 4035: insulating layer, 4053: conductive layer, 4061: semiconductor layer, 4062: p-type impurity region, 4063: high-resistance semiconductor region, 4064: n-type impurity region, 4065: conductive layer.

The invention claimed is:

1. A semiconductor device comprising:
   an A/D converter circuit comprising:
      a comparator circuit including a transistor having a first gate, a second gate, and a semiconductor layer interposed between the first gate and the second gate;
      an A/D conversion controller circuit; and a D/A converter, wherein one of a source and a drain of the transistor is electrically connected to an input terminal of the A/D conversion controller circuit, wherein a first terminal of the A/D conversion controller circuit is electrically connected to an input terminal of the D/A converter, wherein an output terminal of the D/A converter is electrically connected to the second gate of the transistor, and wherein the first gate of the transistor is an input terminal of the A/D converter circuit.

2. The semiconductor device according to claim 1,
wherein the semiconductor layer is an oxide semiconductor layer.

3. The semiconductor device according to claim 2,
wherein a carrier concentration of the oxide semiconductor layer is less than $1 \times 10^{14}/cm^3$.

4. The semiconductor device according to claim 1,
wherein a second terminal of the A/D conversion controller circuit is an output terminal of the A/D converter circuit.

5. A display device including the semiconductor device according to claim 1, a pixel circuit, and a driver circuit for controlling the pixel circuit.

6. A semiconductor device comprising:
a photoelectric conversion circuit; and
an A/D converter circuit comprising:
   a comparator circuit including a transistor having a first gate, a second gate, and a semiconductor layer interposed between the first gate and the second gate;
   an A/D conversion controller circuit; and
   a D/A converter,
wherein one of a source and a drain of the transistor is electrically connected to an input terminal of the A/D conversion controller circuit, wherein a first terminal of the A/D conversion controller circuit is electrically connected to an input terminal of the D/A converter, wherein an output terminal of the D/A converter is electrically connected to the second gate of the transistor, and wherein the first gate of the transistor is electrically connected to the photoelectric conversion circuit.

7. The semiconductor device according to claim 6,
wherein the semiconductor layer is an oxide semiconductor layer.

8. The semiconductor device according to claim 7,
wherein a carrier concentration of the oxide semiconductor layer is less than $1 \times 10^{14}/cm^3$.

9. The semiconductor device according to claim 6,
wherein a second terminal of the A/D conversion controller circuit is an output terminal of the A/D converter circuit.

10. A display device including the semiconductor device according to claim 6, a pixel circuit, and a driver circuit for controlling the pixel circuit.

11. The display device according to claim 10,
wherein the pixel circuit and the photoelectric conversion circuit are included in a display portion.

12. A semiconductor device comprising:
an A/D converter circuit comprising:
   a comparator circuit including a transistor having a first gate, a second gate, and a semiconductor layer interposed between the first gate and the second gate;
   an A/D conversion controller circuit; and
   a D/A converter, wherein the comparator circuit is configured to compare a voltage of a first signal inputted to the first gate of the transistor and a threshold voltage of the transistor and to output a second signal corresponding to comparison results to the A/D conversion controller circuit, wherein the A/D conversion controller circuit is configured to output a third signal corresponding to the second signal to the D/A converter, and wherein the D/A converter is configured to convert the third signal into an analog signal and to output the analog signal to the second gate of the transistor so as to change the threshold voltage of the transistor.

13. The semiconductor device according to claim 12,
wherein the semiconductor layer is an oxide semiconductor layer.

14. The semiconductor device according to claim 13,
wherein a carrier concentration of the oxide semiconductor layer is less than $1 \times 10^{14}/cm^3$.

15. The semiconductor device according to claim 12,
wherein the A/D conversion controller circuit is configured to output a digital signal having a digital value corresponding to the first signal.

16. A display device including the semiconductor device according to claim 12, a pixel circuit, and a driver circuit for controlling the pixel circuit.

17. A semiconductor device comprising:
a photoelectric conversion circuit; and
an A/D converter circuit comprising:
   a comparator circuit including a transistor having a first gate, a second gate, and a semiconductor layer interposed between the first gate and the second gate;
   an A/D conversion controller circuit; and
   a D/A converter,
wherein the photoelectric conversion circuit is configured to output a first signal to the first gate of the transistor, wherein the comparator circuit is configured to compare a voltage of the first signal inputted to the first gate of the transistor and a threshold voltage of the transistor and to output a second signal corresponding to comparison results to the A/D conversion controller circuit, wherein the A/D conversion controller circuit is configured to output a third signal corresponding to the second signal to the D/A converter, and wherein the D/A converter is configured to convert the third signal into an analog signal and to output the analog signal to the second gate of the transistor so as to change the threshold voltage of the transistor.

18. The semiconductor device according to claim 17,
wherein the semiconductor layer is an oxide semiconductor layer.

19. The semiconductor device according to claim 18,
wherein a carrier concentration of the oxide semiconductor layer is less than $1 \times 10^{14}/cm^3$.

20. The semiconductor device according to claim 17,
wherein the A/D conversion controller circuit is configured to output a digital signal having a digital value corresponding to the first signal.

21. A display device including the semiconductor device according to claim 17, a pixel circuit, and a driver circuit for controlling the pixel circuit.

22. The display device according to claim 21,
wherein the pixel circuit and the photoelectric conversion circuit are included in a display portion.

* * * * *

UNITED STATES PATENT AND TRADEMARK OFFICE
CERTIFICATE OF CORRECTION

PATENT NO. : 8,610,696 B2
APPLICATION NO. : 13/020829
DATED : December 17, 2013
INVENTOR(S) : Kurokawa It is certified that error appears in the above-identified patent and that said Letters Patent is hereby corrected as shown below:

In the Specification

Column 5, line 67, "$112e$" should read --$112c$--.

Column 6, line 1, "$12a$" should read --$112a$--.

Column 6, line 16, "DIA" should read --D/A--.

Column 6, line 35, "DIA" should read --D/A--.

Column 8, line 41, "is of" should read --is off--.

Column 10, line 2, "$111e$" should read --$111c$--.

Column 11, line 20, "$111e$" should read --$111c$--.

Column 11, line 24, "531" should read --S31--.

Column 11, line 50, "533" should read --S33--.

Column 15, line 27, "DIA" should read --D/A--.

Column 15, line 28, "DIA" should read --D/A--.

Column 22, line 20, "$402e$" should read --$402c$--.

Column 22, line 27, "$405e$" should read --$405c$--.

Column 22, line 28, "$406e$" should read --$406c$--.

Column 22, line 29, "$403e$" should read --$403c$--.

Column 22, line 30, "$402e$" should read --$402c$--.

Signed and Sealed this
Twenty-seventh Day of May, 2014

Michelle K. Lee
*Deputy Director of the United States Patent and Trademark Office*